(12) United States Patent
Day et al.

(10) Patent No.: US 8,041,527 B2
(45) Date of Patent: Oct. 18, 2011

(54) SYSTEM AND METHOD FOR TRANSLATING VARIATION INFORMATION BETWEEN COMPUTER 3D VARIATION MODELS AND GEOMETRIC DIMENSIONING AND TOLERANCING CALLOUTS

(75) Inventors: James A Day, Bellevue, WA (US);
Zuozhi Zhao, Schenectady, NY (US);
Yanyan Wu, Schenectady, NY (US);
Dean M. Robinson, Schenectady, NY (US)

(73) Assignee: The Boeing Company, Chicago, IL (US)

( * ) Notice: Subject to any disclaimer, the term of this patent is extended or adjusted under 35 U.S.C. 154(b) by 937 days.

(21) Appl. No.: 11/757,167

(22) Filed: Jun. 1, 2007

(65) Prior Publication Data
US 2008/0300711 A1    Dec. 4, 2008

(51) Int. Cl.
*G01N 37/00* (2006.01)
(52) U.S. Cl. .......................................................... 702/85
(58) Field of Classification Search .................... 702/85, 702/150–153, 198; 345/419
See application file for complete search history.

(56) References Cited

U.S. PATENT DOCUMENTS

| | | | |
|---|---|---|---|
| 5,956,251 | A | 9/1999 | Atkinson et al. |
| 7,024,263 | B2 | 4/2006 | Drake, Jr. et al. |
| 2005/0093860 | A1* | 5/2005 | Yanagisawa et al. ......... 345/419 |

OTHER PUBLICATIONS

User Manual for 3DCS Analyst on CAA Version 5 Software, Jul. 2006, produced by Dimensional Control Systems, 479 pgs (Part 1 and Part 2).

* cited by examiner

*Primary Examiner* — Mohamed Charioui
(74) *Attorney, Agent, or Firm* — Caven & Aghevli LLC

(57) ABSTRACT

Systems and methods are disclosed for consistently translating or converting between geometric dimensioning and tolerancing information and variation parameters for a three dimensional variation analysis tool. The methods and systems may receive geometric dimensioning and tolerancing information; translate, with a computer, the received geometric dimensioning and tolerancing information into variation parameters for a three dimensional variation analysis tool; and output the variation parameters.

19 Claims, 24 Drawing Sheets

SYSTEM AND METHOD FOR TRANSLATING VARIATION INFORMATION BETWEEN COMPUTER 3D VARIATION MODELS AND GEOMETRIC DIMENSIONING AND TOLERANCING CALLOUTS

BACKGROUND

1. Technical Field

Embodiments of the disclosure relate to systems and methods used to translate information between computer three dimensional variation models and geometric dimensioning and tolerancing (GD&T) callouts.

2. Description of the Related Art

There have been longstanding issues regarding how to effectively translate variation information between three dimensional (3D) variation analysis simulation tools and Geometric Dimensioning & Tolerancing (GD&T) callouts used to define allowable variation on drawings and in datasets for product definition.

The American Society Of Mechanical Engineers (ASME) Standard ASME Y14.5M GD&T is the industry standard product definition language that engineers use to establish allowable deviations from nominal. This language is predominantly a geometric requirements language. GD&T is one of the methods to describe the process capabilities used to refine variations analysis for a more accurate representation of variation. However, GD&T is not the only method.

Analysts can be very clever in developing an accurate characterization of variation that goes beyond the descriptions GD&T covers. However, in the end it is necessary to use GD&T to communicate the allowable variation of components and assemblies as established through analysis. In addition, analysts need to translate GD&T into variation models in 3D variation analysis tools in order to perform 3D variation analysis.

3D variation analysis simulations are computer simulations that predict the final state deviations of assembled components based on the components allowable variation and the proposed build indexing and sequencing of the components. The components allowable variation is defined as a range and distribution type and is a user defined input to the simulation software. The output of the software is also a variation range and distribution type for a measured value.

A variation analyst needs to translate GD&T into the 3D variation analysis tool in order to perform the 3D variation analysis. If the component's GD&T is undefined at the time the analysis is created, the analyst determines the allowable variation with the analysis software. This allowable variation must then be translated into a GD&T callout to be applied to the component. Since the way the 3D variation analysis tools represent variation is different from how variation is described using GD&T, there is a need to develop a generic method to translate GD&T specifications into the analysis software and vice versa.

Inconsistent and creative translations have resulted in analyses that either over constrain component tolerances, thus increasing component costs, or under constrain component tolerances which then drive costs into the assembly process. These are recurring costs that continue until a new analysis is performed with accurate translations.

The unique characteristic of this problem is the fundamental difference that exists between the languages used in GD&T and 3D variation analysis. The language used in the variation analysis process is a set of equations used either singularly or in combinations to simulate actual production variation. GD&T defines the limits or boundaries of allowable variation and depending on the geometry and applied symbology there is almost an infinite number of boundary situations. The inherent differences of the two languages require a rigorous set of standardized rules to ensure accurate translations are made between the two languages.

Some software vendor help files describe general relationships between simulated variation and GD&T but do not provide the level of detail required for consistent translation. Thus, analysts usually rely on their experience and intuition to perform ad-hoc translations. However, translations based on analysts' experience may not be consistent and typically can not be reliably validated.

Accordingly, there is a need for systems and methods that can translate variation information between computer 3D variation models and GD&T.

SUMMARY

Embodiments of the disclosure may advantageously address the problems identified above by providing, in one embodiment, a method for consistently translating geometric dimensioning and tolerancing information to variation parameters for input into a three dimensional variation analysis tool. The method includes: receiving geometric dimensioning and tolerancing information; translating, with a computer, the received geometric dimensioning and tolerancing information into variation parameters for a three dimensional variation analysis tool; and outputting the variation parameters.

Another embodiment may provide a system that consistently translates geometric dimensioning and tolerancing information to variation parameters for input into a three dimensional variation analysis tool. The system may include: an input device; a processor; an output device; and a computer readable data storage device. The data storage device contains instructions that when called cause: the processor to receive geometric dimensioning and tolerancing information via the input device; the processor to translate the received geometric dimensioning and tolerancing information into variation parameters for a three dimensional variation analysis tool; and the processor to output the variation parameters via the output device.

A further embodiment may provide a method for consistently translating variation parameters from 3D variation models into geometric dimensioning and tolerancing information. The method may include: receiving variation parameters; translating, with a computer, the received variation parameters from a three dimensional variation analysis tool into geometric dimensioning and tolerancing information; and outputting the geometric dimensioning and tolerancing information.

The features, functions, and advantages that have been discussed can be achieved independently in various embodiments of the present invention or may be combined in yet other embodiments further details of which can be seen with reference to the following description and drawings.

BRIEF DESCRIPTION OF THE DRAWINGS

The accompanying drawings incorporated in and forming part of the specification illustrate several embodiments of the disclosure. In the drawings.

DETAILED DESCRIPTION

The application of conversion methods and tools in accordance with the present disclosure may speed up variation modeling processes and improve variation modeling accuracy. It also may improve consistency of conversion or translation between GD&T and 3D variation models.

Figure 1:
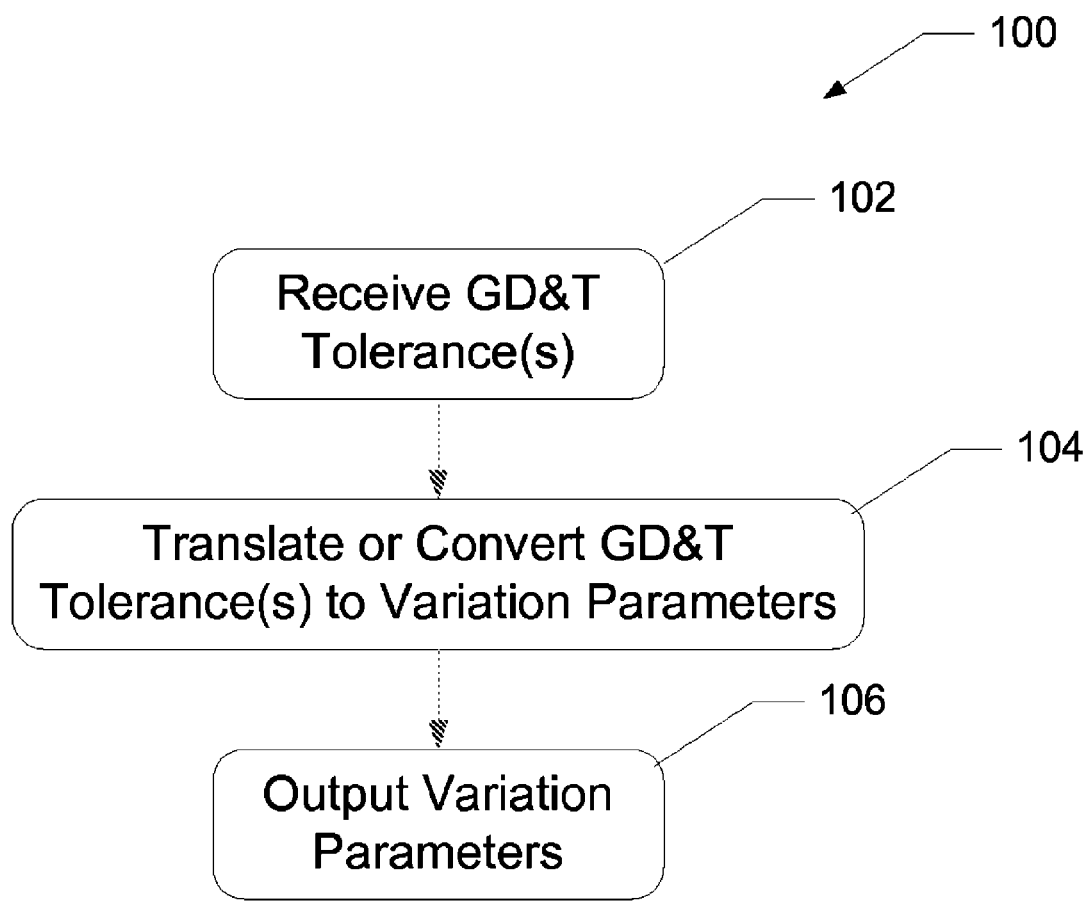
FIG. 1 illustrates a process for translating or converting GD&T tolerance(s) to variation parameters for a 3D variation analysis tools in accordance with one embodiment.
Figure 2:
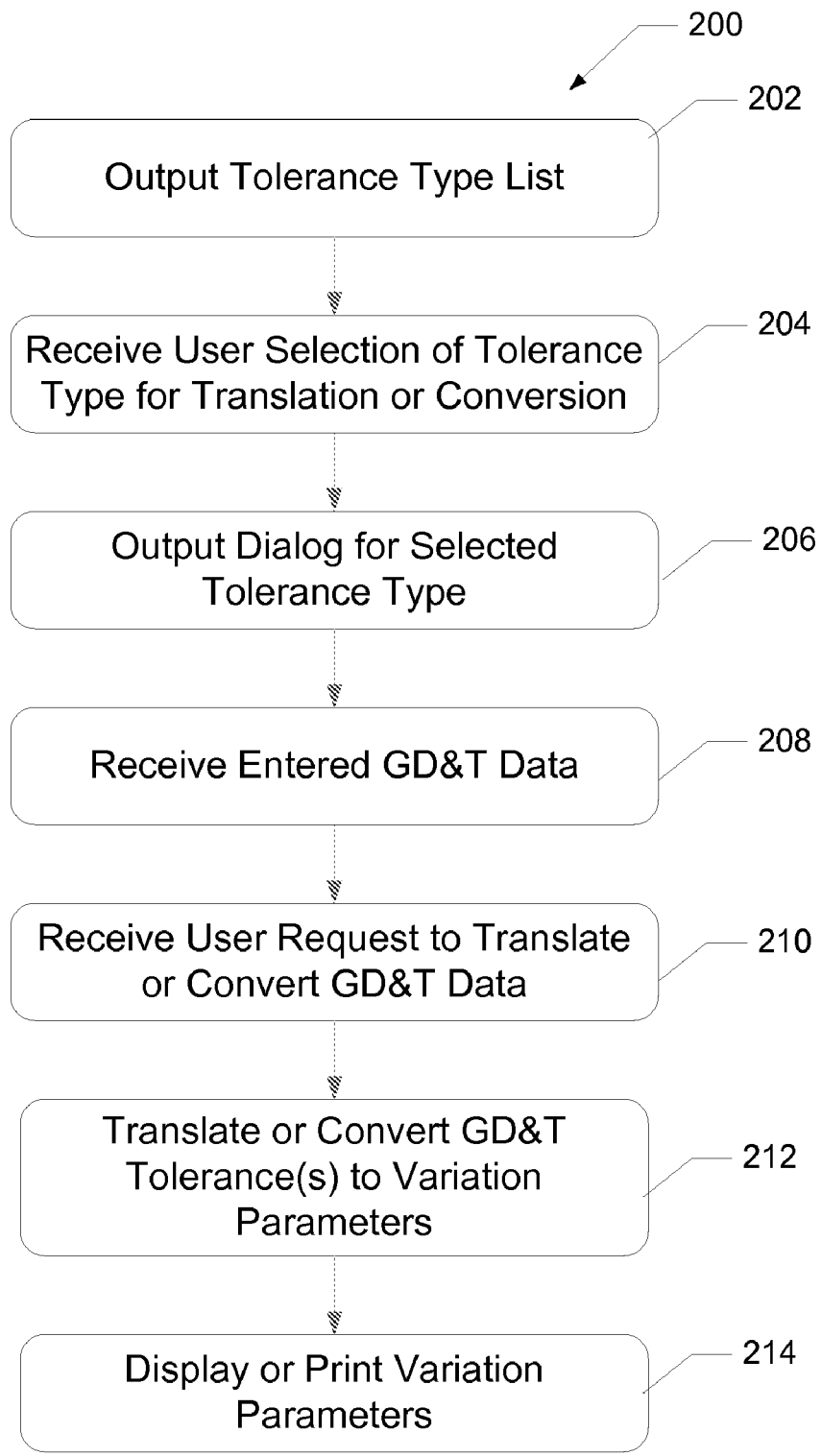
FIG. 2 illustrates a process for translating or converting GD&T tolerance(s) to variation parameters for a 3D variation analysis tools in accordance with a further embodiment.
Figure 3:
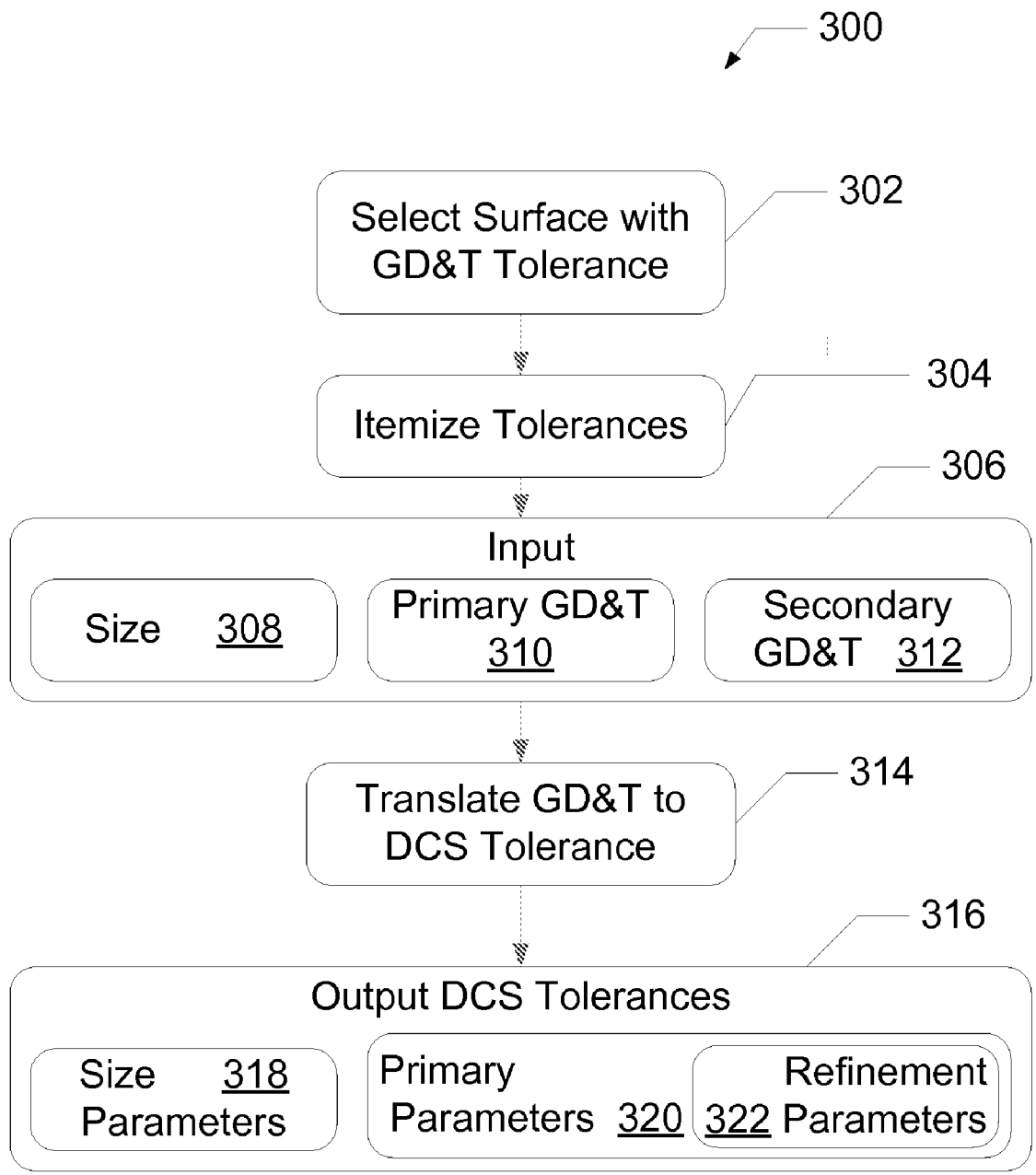
FIG. 3 illustrates an exemplary process for translating or converting GD&T tolerance(s) to variation parameters for a 3D variation analysis tools in accordance with another embodiment.
Figure 21:
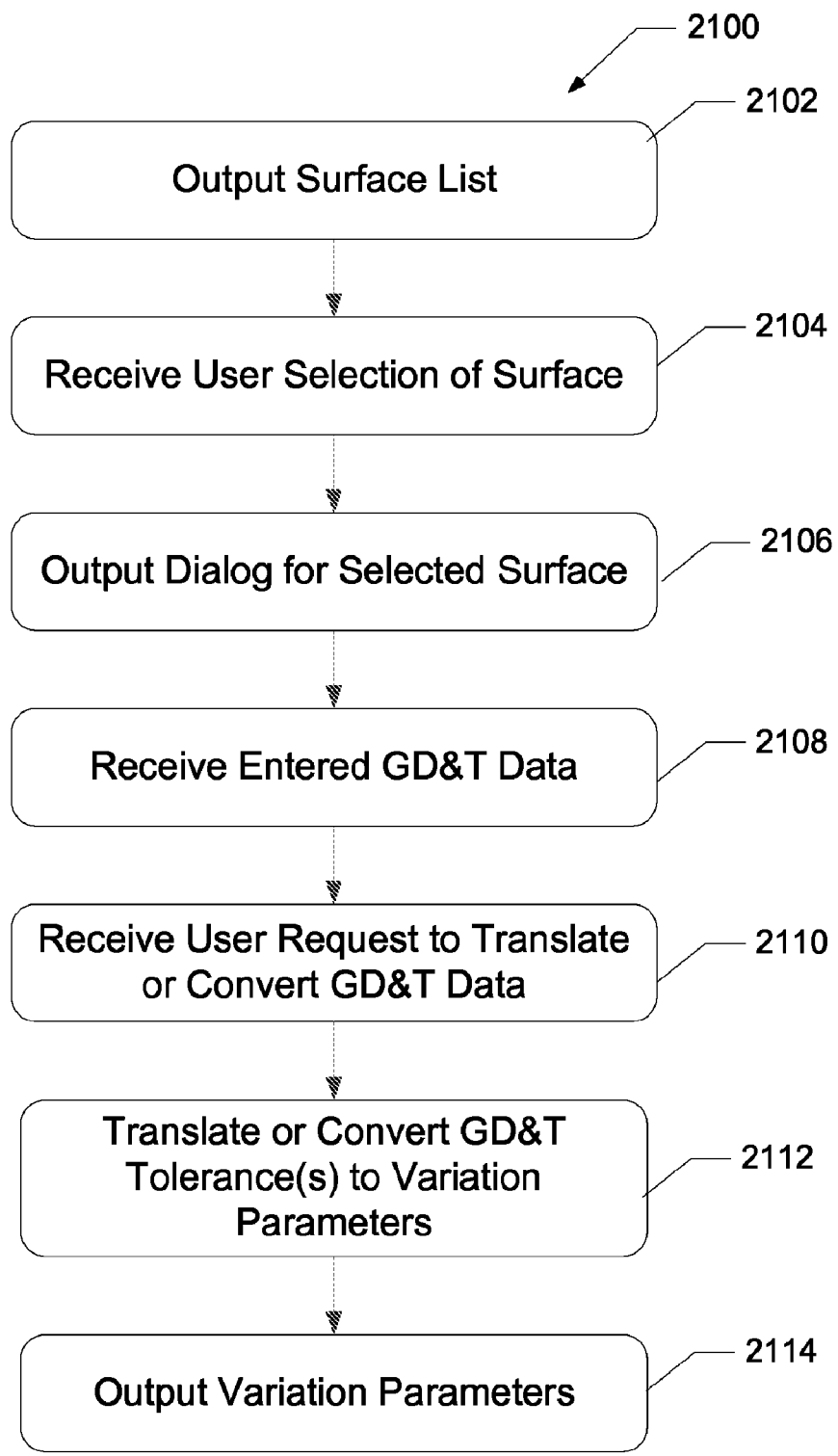
FIG. 21 illustrates an exemplary process for translating or converting GD&T tolerance(s) to variation parameters for a 3D variation analysis tools in accordance with another embodiment

There are two approaches that may be taken to translate or convert between GD&T callouts and variation parameters for a 3D variation model. In one approach, each GD&T callout is translated on as an individual callout. In a second approach, a surface is selected and then the callouts associated with the surface are converted or translated. FIGS. 1 and 2 provide additional detail regarding embodiments that use the first approach. FIGS. 3 and 21 provide additional detail regarding embodiments that use the second approach.

FIG. 1 illustrates one example of a process that may be used to convert GD&T tolerance callouts to variation parameters for a 3D variation model. Process 100 begins with block 102 where the GD&T tolerances are received. In block 104 the GD&T tolerance(s) are converted to variation parameters for a 3D variation model. Thereafter the variation parameters are output in block 106.

In some embodiments, the output (block 106) is to a display or printer. In other embodiments the output may be directly to the 3D variation model. While outputting to the model saves time, the translator or converter must be programmed to output the data in a format the particular 3D variation model can use. In contrast, when the user receives the output, the user can check to verify that the output values are in the expected range and that an input error was not made.

In some embodiments, the translator or converter (block 104) is a tool or software that is installed in memory on a computer. The computer may be a special purpose or general purpose computer as is now known or may become known in the future. In further embodiments, the tool may be formed from hardware such as an application-specific integrated circuit (ASIC). In a similar fashion, the tool may also be formed using a combination of hardware and software. In other embodiments the tool or software is stored on a computer readable medium. The tool and supporting hardware form a translating or converting system. FIGS. 4-14, discussed in detail below illustrate examples of processes that may be included in different embodiments of the tool or software. In further embodiments the tool or software may use look up tables in the tool or software in order to convert the GD&T callouts to variation parameters.

FIG. 2 illustrates a second example of a conversion/translation process. In FIG. 2, process 200 begins by outputting (e.g., displaying, printing, etc.) a tolerance type list in block 202. Typically, this list is displayed on a computer monitor. However, in some embodiments, the output could be to a printer. Other devices that provide visual, tactile or audio output to a user could also be used.

In block 204, the process 200 receives a user selection of one of the tolerance types from the list displayed in block 202. In response to receiving the selection, a dialog for the selected tolerance type is output in block 206. Typically, the dialog is displayed on a monitor or other visual display. In other embodiments, devices that provide visual, tactile or audio output to a user could also be used.

The process 200 receives the entered GD&T data in block 208. The data may include tolerance ranges, answers to questions about the GD&T information in the callout, and other GD&T information from the callout. In some embodiments, the user would indicate that the dialog was complete by requesting the process 200 translate or convert the GD&T data. In block 210, the process 200 may receive this request. The user may make a request by selecting a button with a pointing device or striking/pushing one or more keys on keyboard.

The entered GD&T data is converted or translated in block 212 into variation parameters. This translation or conversion process is similar to that discussed above for block 104. The variation parameter(s) may be output in block 214 using a display or printer. In other embodiments devices that provide visual, tactile or audio output to a user could also be used.

FIG. 3 illustrates a further embodiment of a process that may be used to translate or convert GD&T information into variation parameters for 3D variation models. In FIG. 3, the process 300 begins with the selection of a surface that has a tolerance callout in block 302. Examples of the surface include, but are not limited to, cylindrical, general and planar.

Thereafter the tolerances for the selected surface are itemized in block 304. This step ensures that all the tolerances that are applied to the surface are considered and input in block 306. Examples of the types of tolerances that may apply to the selected surface include, but are not limited to, size in block 308, primary GD&T tolerances in block 310, and secondary GD&T tolerances in block 312. The input may be provided by a user or by the conversion or translator tool or computer program extracting the tolerances from the computer aided design (CAD) tool or computer program.

In block 314, the GD&T information is translated or converted to variation parameters (tolerances) that may be entered or used by a suitable software tool such as 3DCS. 3DCS is a software tool produced by Dimension Control Systems, Inc. of Troy, Mich. for performing 3D variation modeling. In other embodiments other software tools may be used. This translation or conversion may use processes similar to those shown in FIGS. 4-14, but modified to reflect that the surface is identified prior to the identification of the GD&T callout. Alternatively, the translation or conversion may use a database look up table, or equivalent structure.

The variation parameters (tolerances) are output at block 316. This output may take the form of a visual display or a print out. Other devices that provide visual, tactile or audio output to a user could also be used. In some embodiments the output may be directly to the software tool. The output may include one or more of size parameters 318, primary parameters 320, or refinement parameters 322. The output may also include other information or data needed or desired by the variation model.

FIG. 21 illustrates a further example of a conversion/translation process. In FIG. 21, process 2100 begins by outputting (e.g., displaying, printing, etc.) a surface list in block 2102. Examples of surfaces include, but are not limited to, cylindrical, general, and planar. Typically, this list is displayed on a computer monitor. However, in some embodiments, the output could be to a printer. Other devices that provide visual, tactile or audio output to a user could also be used.

In block 2104, the process 2100 receives a user selection of one of the surfaces from the list displayed in block 2102. In response to receiving the selection, a dialog for the selected surface is output in block 2106. Typically, the dialog is displayed on a monitor or other visual display. In other embodiments, devices that provide visual, tactile or audio output to a user could also be used.

The process 2100 receives the entered GD&T data associated with a callout related to the selected surface in block 2108. The data may include tolerance ranges, answers to questions about the GD&T information in the callout, and other GD&T information from the callout. In some embodiments, the user would indicate that the dialog was complete by requesting the process 2100 translate or convert the GD&T data. In block 2110, the process 2100 may receive this request. The user may make a request by selecting a button with a pointing device or striking/pushing one or more keys on keyboard.

The entered GD&T data is converted or translated in block 2112 into variation parameters. This translation or conversion process may be similar to that discussed above for blocks 104, 212, or 314. The variation parameter(s) may be output in block 2114 using a display or printer. In other embodiments devices that provide visual, tactile or audio output to a user could also be used.

FIGS. 4-14 provide examples of various processes that may be used to convert GD&T tolerance callouts to variation parameters. Based on the examples provided, a person of ordinary skill, can develop processes for other callouts.

Figure 4:
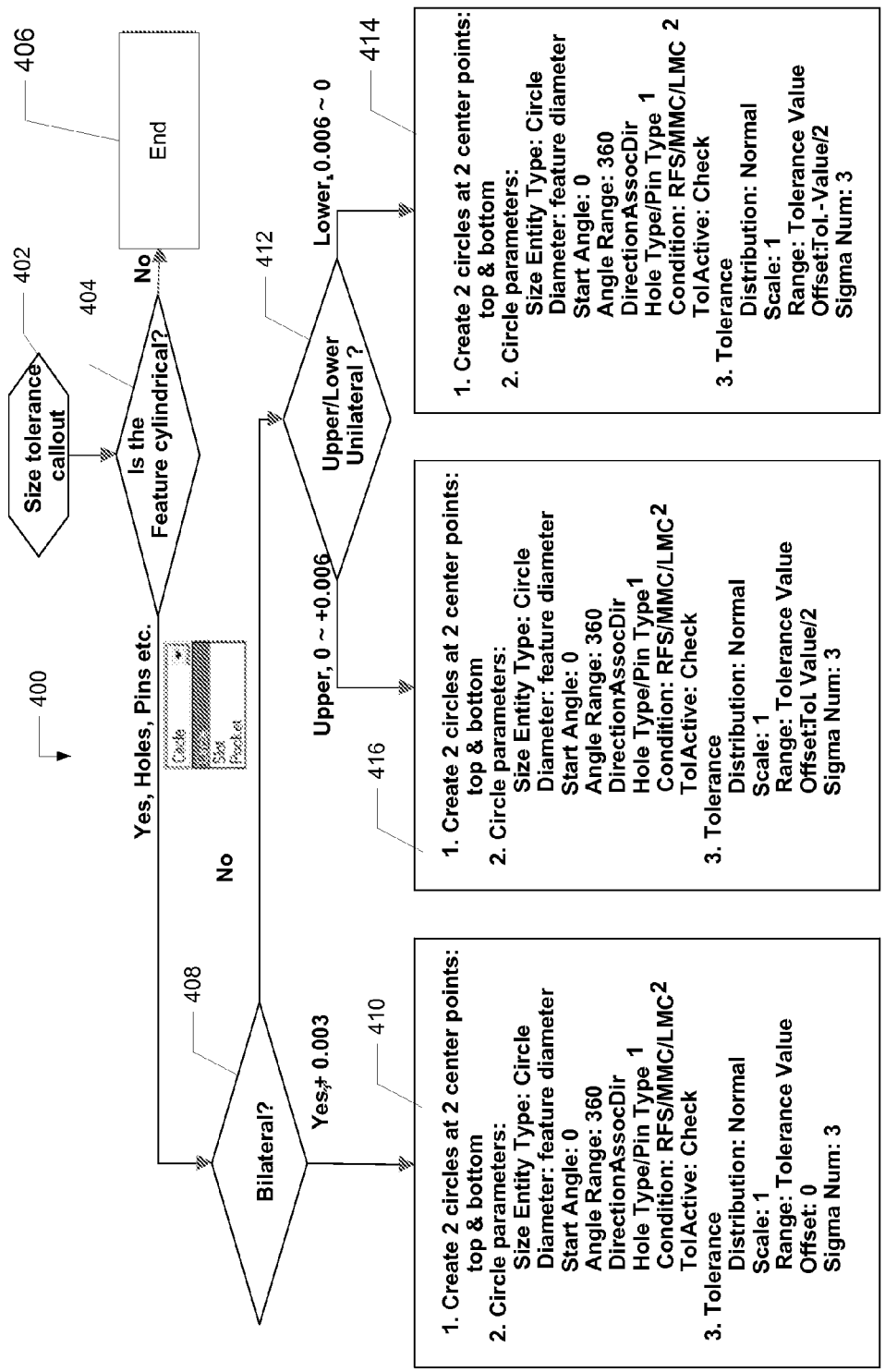
FIG. 4 illustrates an exemplary conversion or translation process for a GD&T size tolerance callout.

FIG. 4 illustrates an exemplary process for converting a GD&T size tolerance callout to variation parameters. Process 400 begins at block 402 when a size tolerance is selected by the user or extracted from the CAD program. Block 404 checks to see if the feature is cylindrical. If the feature is not cylindrical the process 400 ends at block 406. In other embodiments, the process 400 may continue and consider non-cylindrical features in a similar fashion as shown for cylindrical features.

Next, process 400 checks to see if the tolerance is bilateral in block 408. When the tolerance is bilateral, the process 400 moves to block 410. Block 410 provides an example of translation or conversion to variation parameters for bilateral tolerances of cylindrical features. When the tolerance is not bilateral, the process 400 moves to block 412.

Block 412 determines whether the tolerance is upper unilateral or lower unilateral. If the GD&T size tolerance is upper unilateral, then the process 400 moves to block 416. Block 416 provides an example of translation or conversion to variation parameters for upper tolerances of cylindrical features. If the GD&T size tolerance is lower unilateral, then the process 400 moves to block 414. Block 414 provides an example of translation or conversion to variation parameters for lower tolerances of cylindrical features.

Figure 5:
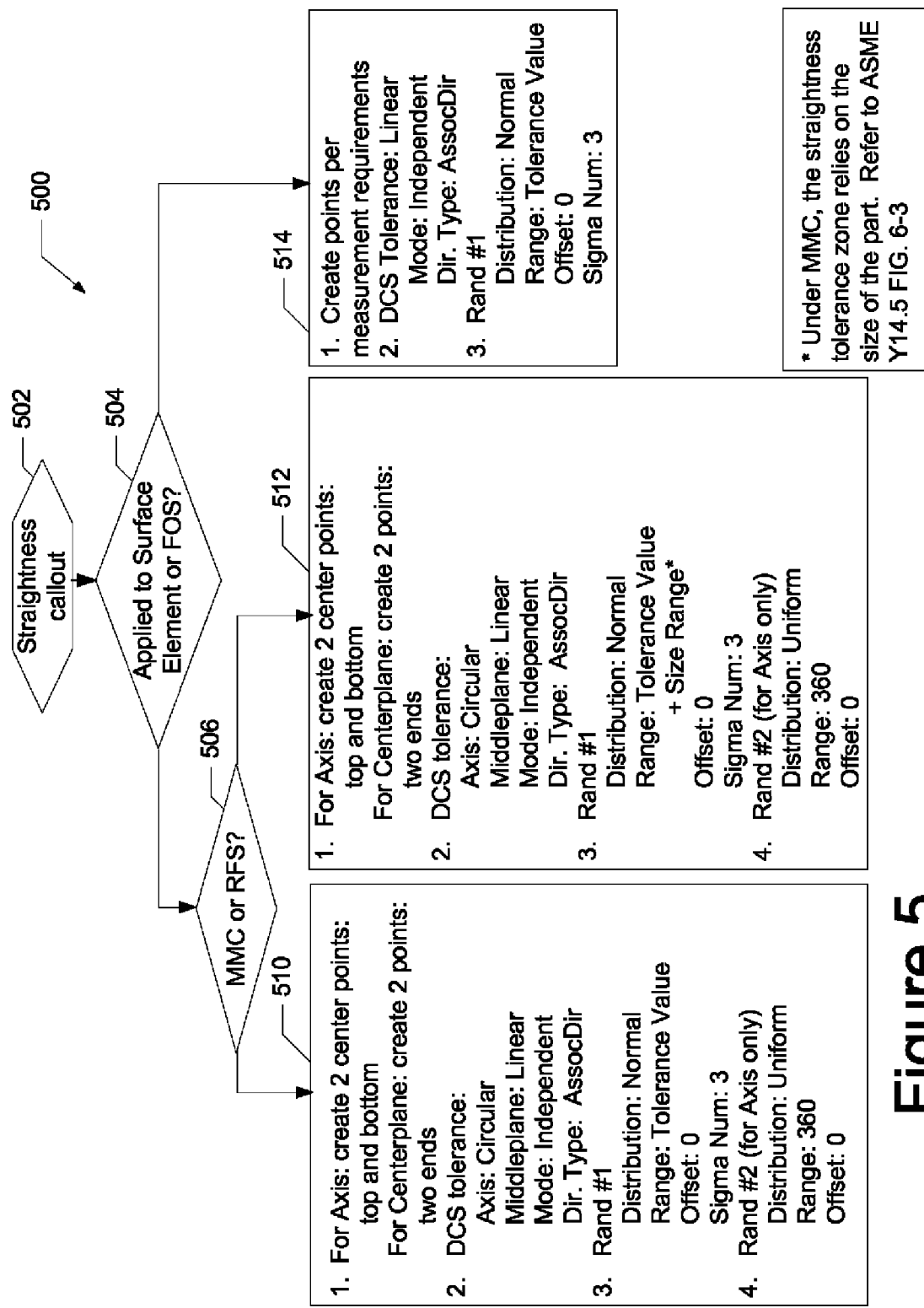
FIG. 5 illustrates an exemplary conversion or translation process for a GD&T straightness tolerance callout.

FIG. 5 illustrates an exemplary process for converting a GD&T straightness tolerance callout to variation parameters. Process 500 begins at block 502 when a straightness tolerance is selected by the user or extracted from the CAD program. Block 504 checks to see if the callout is applied to a feature of size (FOS) or a surface element. When the tolerance is applied to a surface element, the process 500 moves to block 514. Block 514 provides an example of translation or conversion to variation parameters for straightness tolerances of surface elements.

When the straightness callout is applied to a feature of size, process 500 checks to see if the tolerance is a maximum material condition (MMC) or applies regardless of feature size (RFS) in block 506. When the tolerance is a maximum material condition, the process 500 moves to block 512. Block 512 provides an example of translation or conversion to variation parameters for straightness tolerances for features of size with a maximum material condition.

When the tolerance applies regardless of feature size, block 510 provides an example of translation or conversion to variation parameters for straightness tolerances for features of size applied regardless of feature size.

Figure 6:
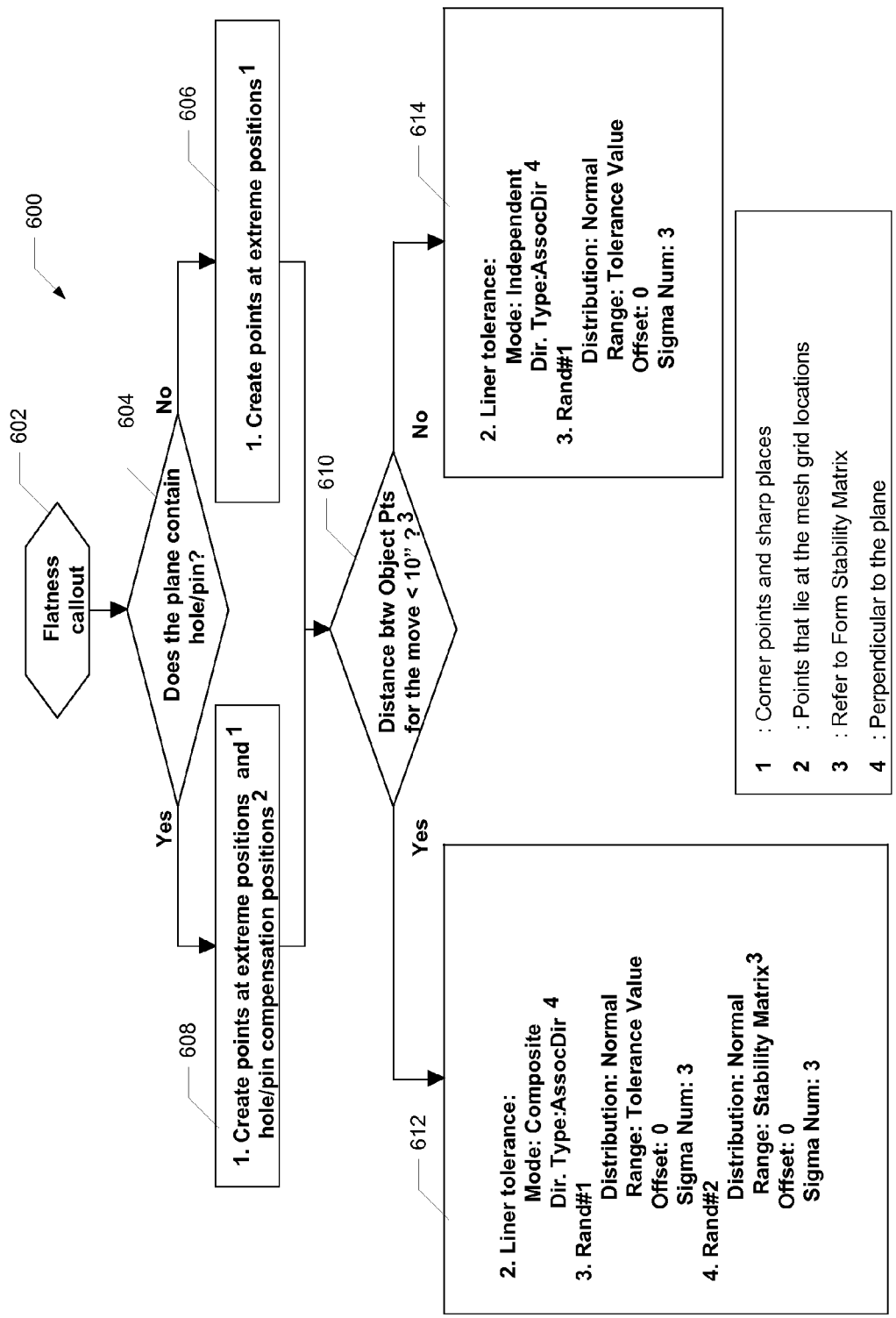
FIG. 6 illustrates an exemplary conversion or translation process for a GD&T flatness tolerance callout.

FIG. 6 illustrates an exemplary process for converting a GD&T flatness tolerance callout to variation parameters. Process 600 begins at block 602 when a flatness tolerance is selected by the user or extracted from the CAD program. Block 604 checks to see if the callout is applied to a plane with a hole or pin or just a plane. When the tolerance is applied to just a plane, the process 600 moves to block 606. Block 606 creates points at extreme positions, for example, corner points and sharp places. When the plane contains holes or pins, process 600 moves to block 608. In block 608 points are created at extreme positions, for examples, corner points and sharp places and hole/pin compensation positions are created.

The process 600 moves from blocks 606 and 608 to block 610. Block 610 checks to see if the distance between the object points created in block 606 or block 608 for the move is less than a predetermined value. In the embodiment shown in FIG. 6, this value is 10, however, other embodiments could use other values. When the distance is less than the predetermined value, process 600 moves to block 612. Block 612 provides an example of translation or conversion to variation parameters for flatness tolerances when the distance between object points for the move is less than a predetermined value. When the distance is not less than the predetermined value, process 600 moves to block 614. Block 614 provides an example of translation or conversion to variation parameters for flatness tolerances when the distance between object points for the move is not less than the predetermined value.

Figure 7:
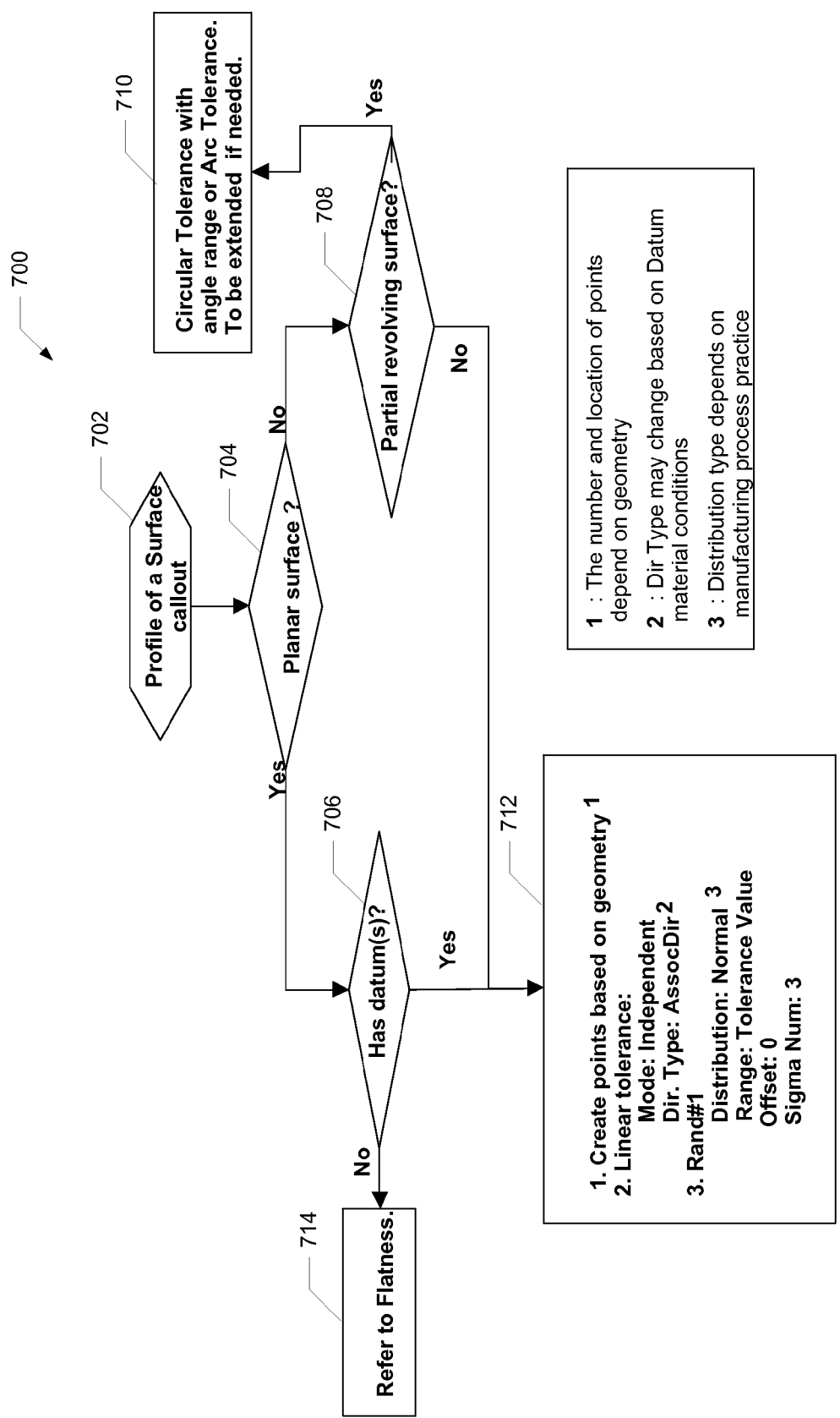
FIG. 7 illustrates an exemplary conversion or translation process for a GD&T surface tolerance callout.

FIG. 7 illustrates an exemplary process for converting a GD&T profile of a surface tolerance callout to variation parameters. Process 700 begins at block 702 when a profile of a surface tolerance is selected by the user or extracted from the CAD program. Block 704 checks to see if the callout is applied to planar surface.

When the tolerance is applied to a planar surface, the process 700 moves to block 706. Block 706 checks to see if the profile has at least one datum. If the planar surface does not have a datum, process 700 moves to block 714 where process 700 may call the process 600 for flatness, an example of which is shown in FIG. 6. When the planar surface has a datum, process 700 moves to block 712. Block 712 provides an example of translation or conversion to variation parameters for profile of a surface tolerance.

When the surface is not planar in block 704, process 700 checks to see if the surface is a partial revolving surface in block 708. When the non-planar surface is a partial revolving surface the process 700 moves to block 710. Block 710 may apply a circular tolerance with an angle range or an arc tolerance. When the non-planar surface is not a partial revolving surface the process 700 moves to block 712, discussed above.

Figure 8:
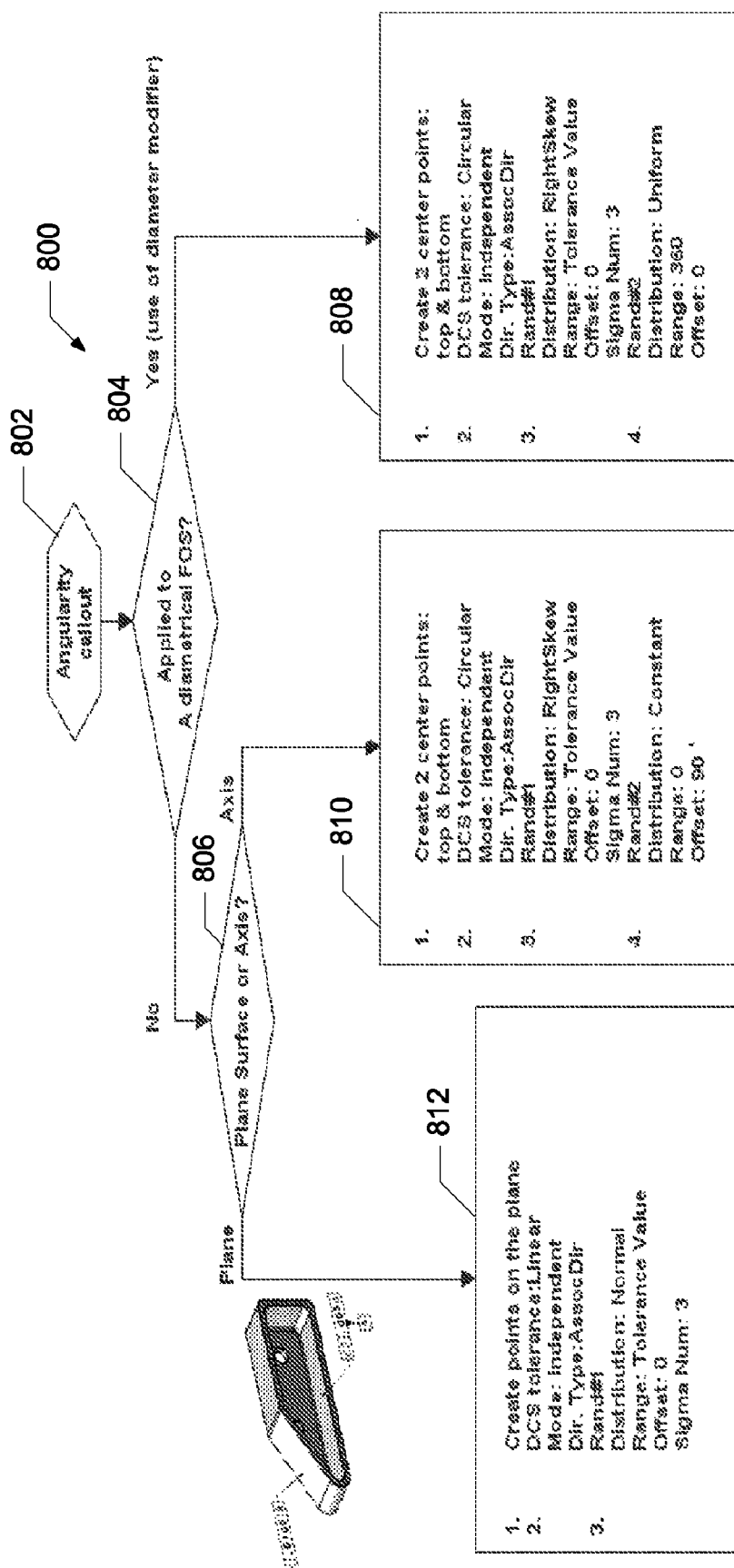
FIG. 8 illustrates an exemplary conversion or translation process for a GD&T angularity tolerance callout.

FIG. 8 illustrates an exemplary process for converting a GD&T angularity tolerance callout to variation parameters. Process 800 begins at block 802 when an angularity tolerance is selected by the user or extracted from the CAD program. Block 804 checks to see if the callout is applied to diametrical feature of size (FOS). When the tolerance is applied to a diametrical FOS, the process 800 moves to block 808. Block 808 provides an example of translation or conversion to variation parameters for angularity tolerances applied to diametrical features of size.

When the tolerance is not applied to a diametrical FOS, the process 800 moves to block 806. Block 806 checks to see if the angularity tolerance is applied to a plane surface or axis. When the tolerance is applied to an axis, process 800 moves to block 810. Block 810 provides an example of translation or conversion to variation parameters for angularity tolerances applied to an axis. When the tolerance is applied to a plane surface, process 800 moves to block 812. Block 812 provides an example of translation or conversion to variation parameters for angularity tolerances applied to a plane surface.

Figure 9:
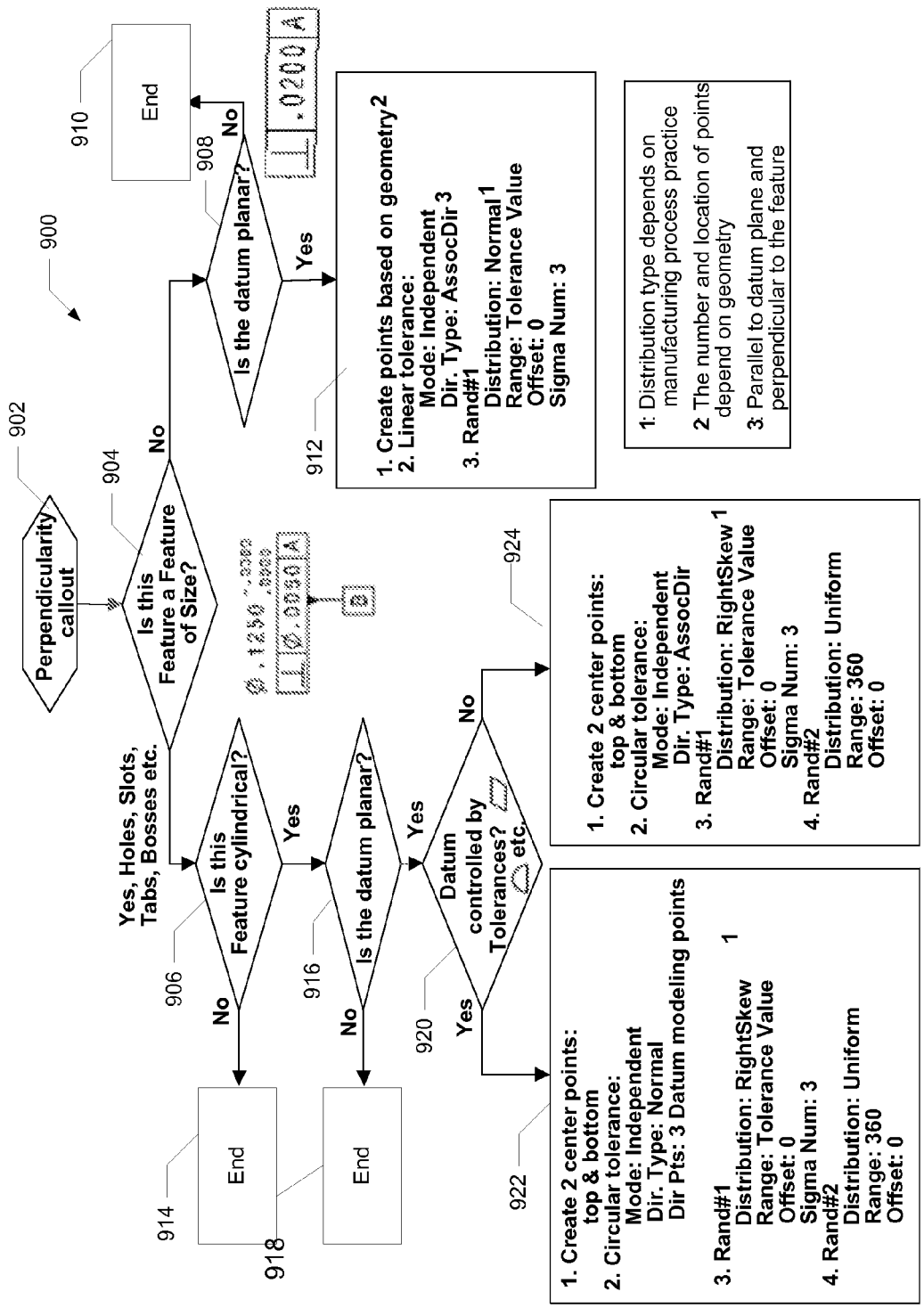
FIG. 9 illustrates an exemplary conversion or translation process for a GD&T perpendicularity tolerance callout.

FIG. 9 illustrates an exemplary process for converting a GD&T perpendicularity tolerance callout to variation parameters. Process 900 begins at block 902 when a perpendicularity tolerance is selected by the user or extracted from the CAD program. Block 904 checks to see if the tolerance is applied to a feature of size (FOS).

If the feature is not a feature of size the process 900 moves to block 908. Block 908 checks to see if the datum is planar. If the datum is not planar, the process moves to block 910 where the process may end. In other embodiments, the process 900 may continue and consider features of size with non-planar datums. When the datum is planar, process 900 moves to block 912. Block 912 provides an example of translation or conversion to variation parameters for perpendicularity tolerances that have a planar datum but are not features of size.

When the tolerance is applied to a feature of size, process 900 moves to block 906. Block 906 checks to see if the feature is cylindrical. When the feature is not cylindrical, the process 900 moves to block 914 where the process may end. In other embodiments, the process 900 may continue and consider non-cylindrical features. If the feature is a cylindrical feature, the process 900 moves to block 916. Block 916 checks to see if the datum is planar. If the datum is not planar, the process moves to block 918 where the process may end. In other embodiments, the process 900 may continue and consider features with non-planar datums.

When the datum is planar, process 900 moves to block 920. Block 920 determines whether the datum is controlled by tolerances. When the datum is controlled by tolerances, the process 900 moves to block 922. Block 922 provides an example of translation or conversion to variation parameters for perpendicularity tolerances of cylindrical features that have a planar datum controlled by tolerances. When the datum is not controlled by tolerances, the process 900 moves to block 924. Block 924 provides an example of translation or conversion to variation parameters for perpendicularity tolerances of cylindrical features that have a planar datum that is not controlled by tolerances.

Figure 10:
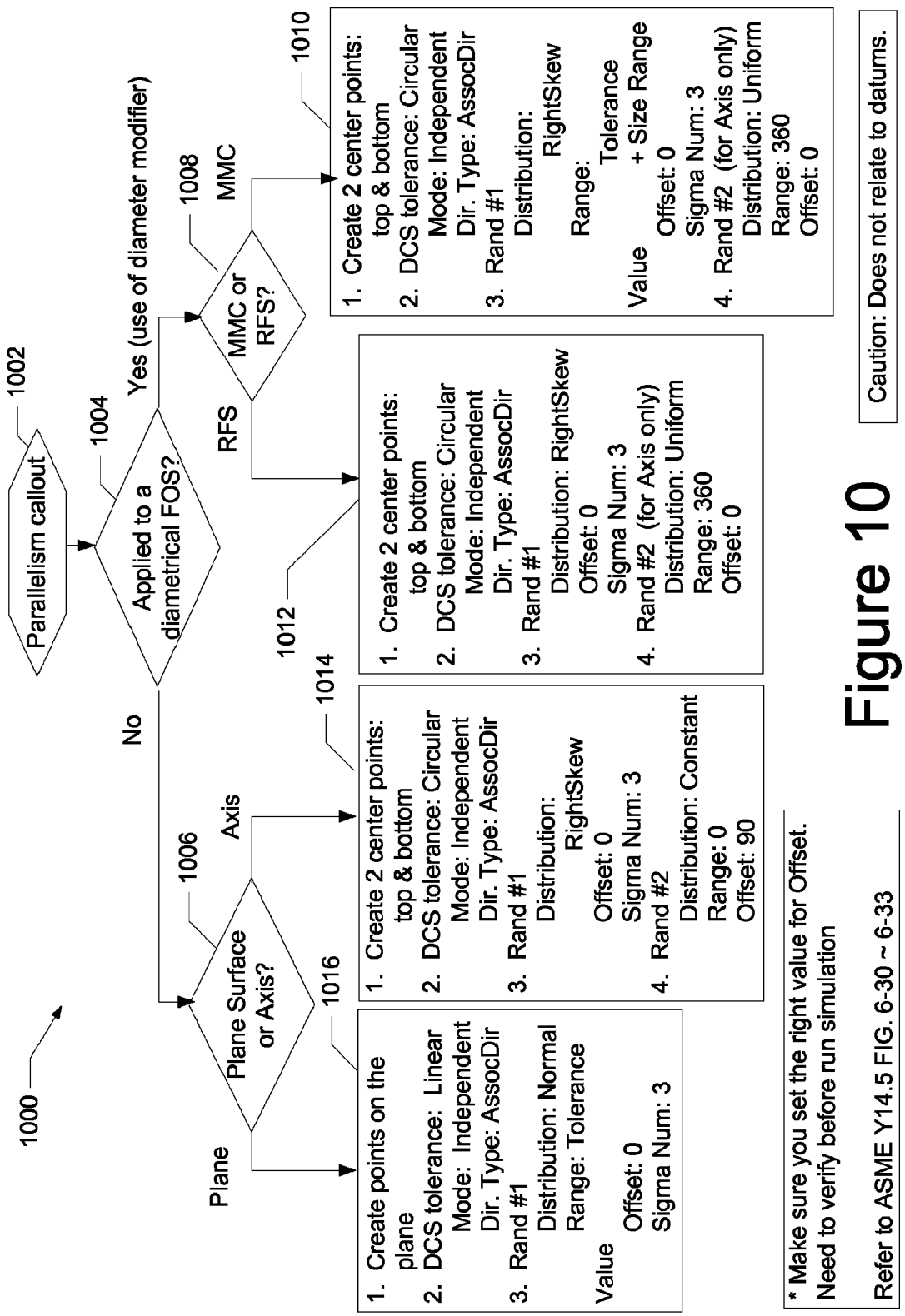
FIG. 10 illustrates an exemplary conversion or translation process for a GD&T parallelism tolerance callout.

FIG. 10 illustrates an exemplary process for converting a GD&T parallelism tolerance callout to variation parameters. Process 1000 begins at block 1002 when a parallelism tolerance is selected by the user or extracted from the CAD program. Block 1004 checks to see if the callout is applied to a diametrical feature of size (FOS).

When the tolerance is applied to a diametrical feature of size, the process 1000 moves to block 1008. In block 1008, process 1000 checks to see if there is a maximum material condition (MMC) or the tolerance is applied regardless of feature size (RFS). When there is a maximum material condition, the process 1000 moves to block 1010. Block 1010 provides an example of translation or conversion to variation parameters for parallelism tolerances for diametrical feature of size with a maximum material condition.

If the tolerance applies regardless of feature size, the process 1000 moves to block 1012. Block 1012 provides an example of translation or conversion to variation parameters for parallelism tolerances for diametrical feature of size and the tolerance applies regardless of feature size.

When the tolerance is not applied to a diametrical feature of size, the process 1000 moves to block 1006. In block 1006, process 1000 checks to see if the tolerance is applied to a plane surface or an axis. When the tolerance is applied to an axis, the process 1000 moves to block 1014. Block 1014 provides an example of translation or conversion to variation parameters for parallelism tolerances for an axis. If the tolerance is applied to a plane surface, the process 1000 moves to block 1016. Block 1016 provides an example of translation or conversion to variation parameters for parallelism tolerances applied to a plane surface.

Figure 11:
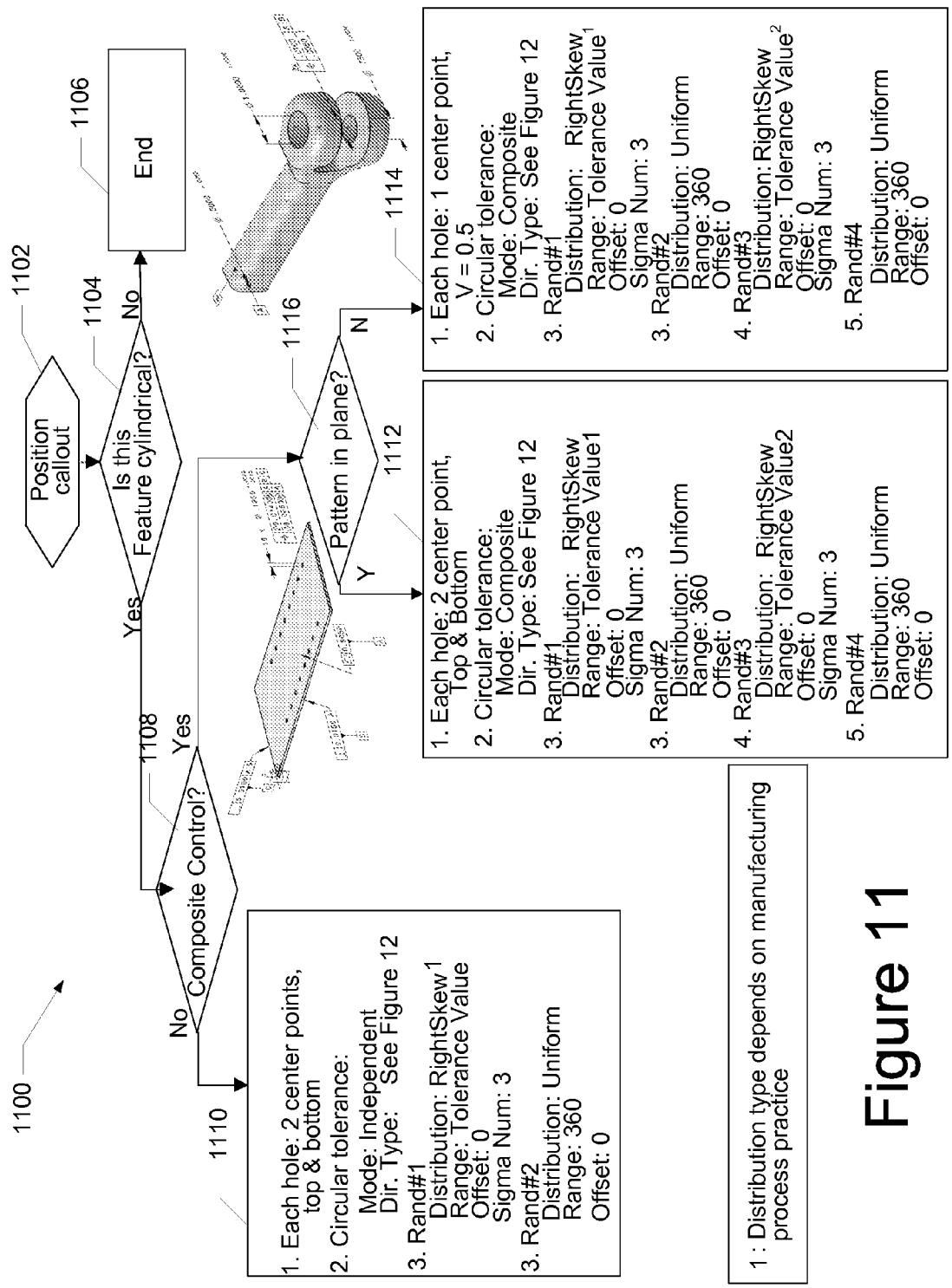
FIG. 11 illustrates an exemplary conversion or translation process for a GD&T position tolerance callout.

FIG. 11 illustrates an exemplary process for converting a GD&T position tolerance callout to variation parameters. Process 1100 begins at block 1102 when a position tolerance is selected by the user or extracted from the CAD program. Block 1104 checks to see if the callout is applied to a cylindrical feature. When the feature is not cylindrical, the process 1100 moves to block 1106. At block 1106 the process may end. In some embodiments process 1100 may continue for non-cylindrical features in a similar manner as shown for cylindrical features.

When the feature is cylindrical, process 1100 moves to block 1108. Block 1108 checks to see if a composite control is applied to or part of the tolerance. When there is not a composite control, process 1100 moves to block 1110. Block 1110 provides an example of translation or conversion to variation parameters for position tolerances of cylindrical features that do not have composite controls.

When there is a composite control, process 1100 moves to block 1116. Block 116 checks to see if there is a pattern in a plane. When the pattern is in a plane, process 1100 moves to block 1112. Block 1112 provides an example of translation or conversion to variation parameters for position tolerances for cylindrical features that have a composite control with the pattern in a plane. When the pattern is not in a plane, process 1100 moves to block 1114. Block 1114 provides an example of translation or conversion to variation parameters for position tolerances for cylindrical features that have a composite control but without the pattern in a plane.

Figure 12:
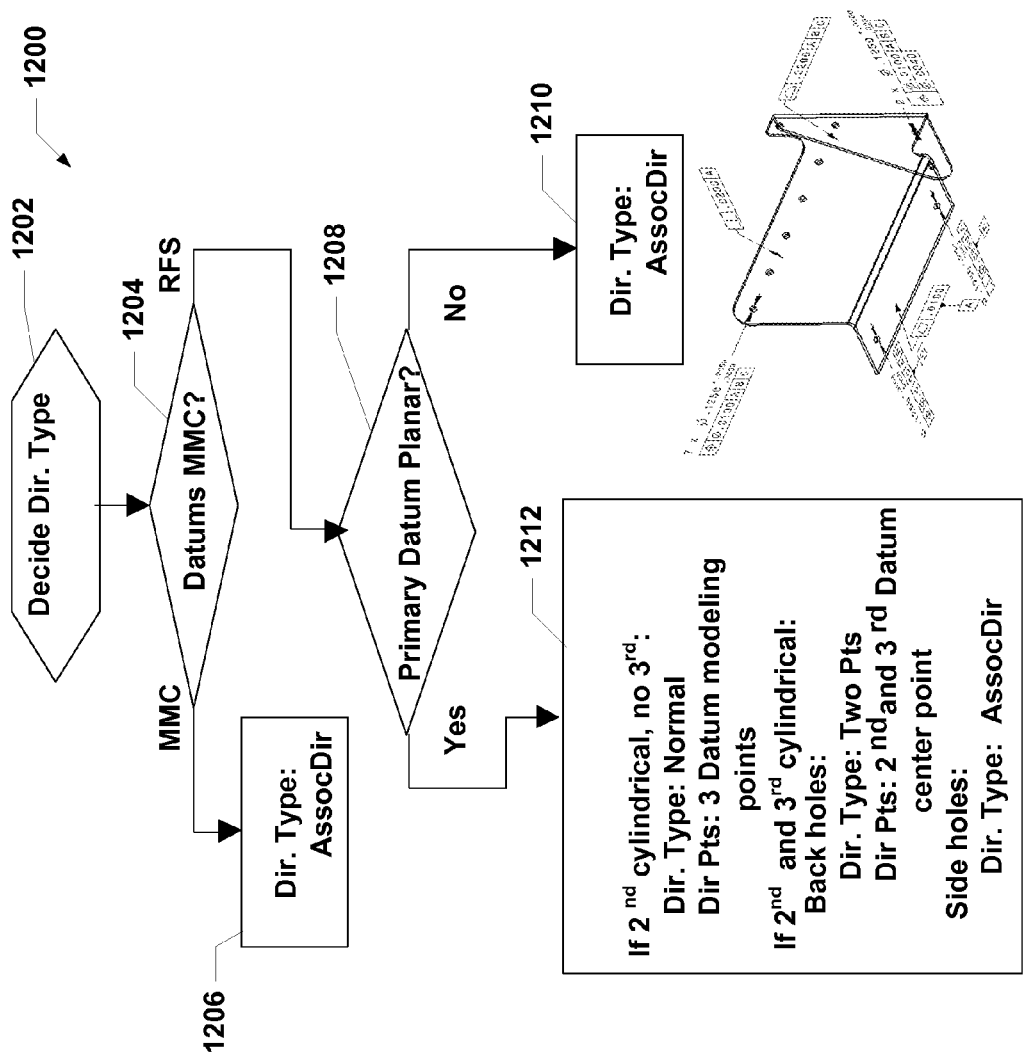
FIG. 12 illustrates an exemplary process for selecting a variation parameter Direction Type.

FIG. 12 illustrates an exemplary process for selecting a Direction Type for the process 1100. Process 1200 begins at block 1202 when a Direction Type is needed in process 1100. Next, block 1204 checks to see if a datum has a maximum material condition (MMC). When the datum has a maximum material condition, block 1206 assigns a Direction type of "AssocDir". Other embodiments may make other assignments and the assignment may be dependent on the 3D variation model used.

If the datum is does not have a maximum material condition, process 1200 moves to block 1208. Block 1208 checks to see if the primary datum is planar. If the primary datum is planar, process 1200 moves to block 1212. Block 1212 provides an example of variation parameters for the circumstances. When the primary datum is non-planar, the process 1100 moves to block 1210. Block 1210 may assign a Direction type of "AssocDir". Other embodiments may make other assignments and the assignment may be dependent on the 3D variation model used.

Figure 13:
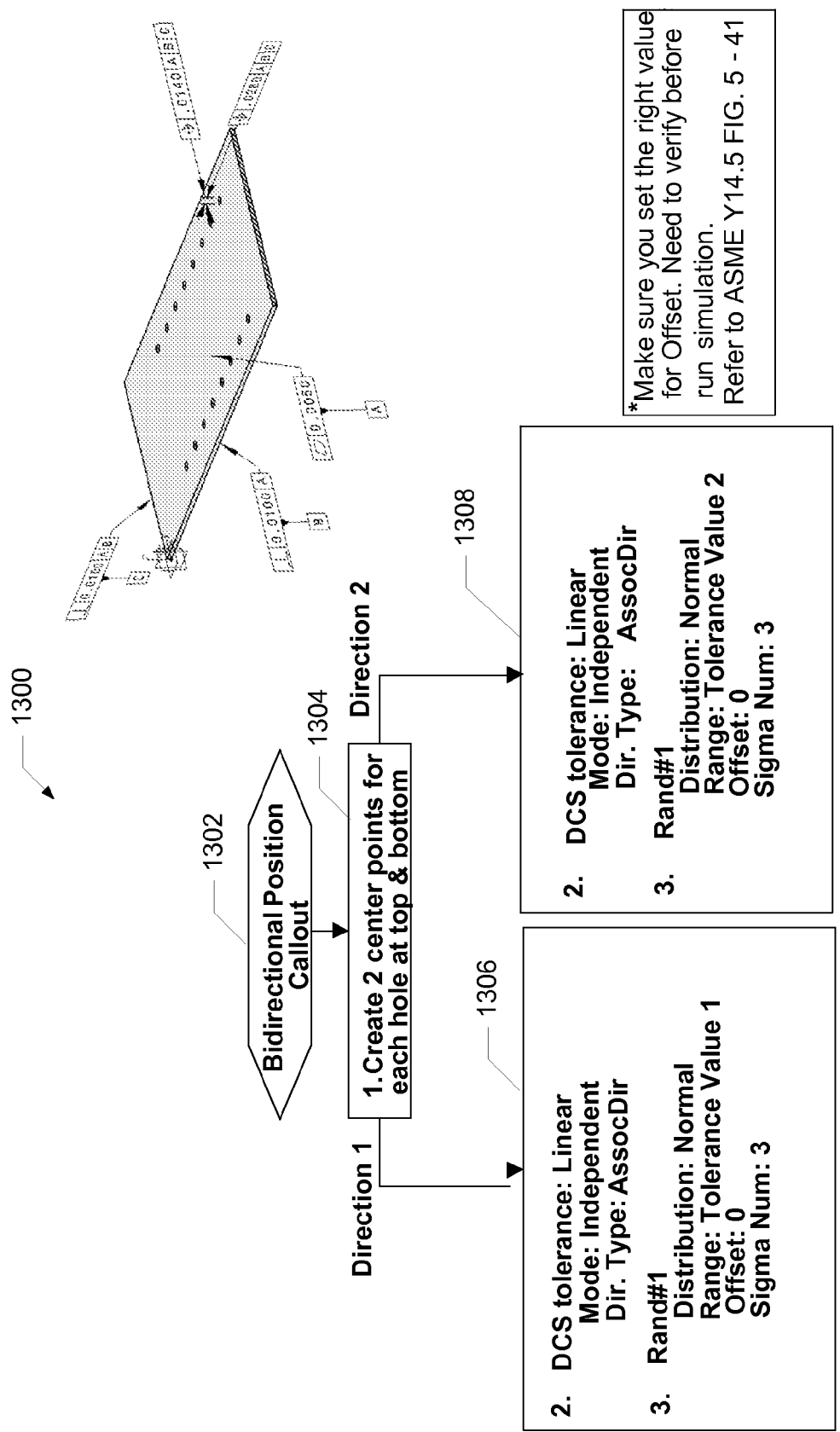
FIG. 13 illustrates an exemplary conversion or translation process for a GD&T bidirectional position tolerance callout.

FIG. 13 illustrates an exemplary process for converting a GD&T bidirectional position tolerance callout to variation parameters. Process 1300 begins at block 1302 when a bidirectional position tolerance is selected by the user or extracted from the CAD program. Block 1304 creates two center points for each hole one at the top and one at the bottom. Process 1300 then moves to blocks 1306 and 1308 in parallel. For the first direction, process 1300 moves to block 1306. Block 1306 provides an example of translation or conversion to variation parameters for bidirectional tolerances applied in the first direction. For the second direction, process 1300 moves to block 1308. Block 1308 provides an example of translation or conversion to variation parameters for bidirectional tolerances applied in the second direction.

Figure 14:
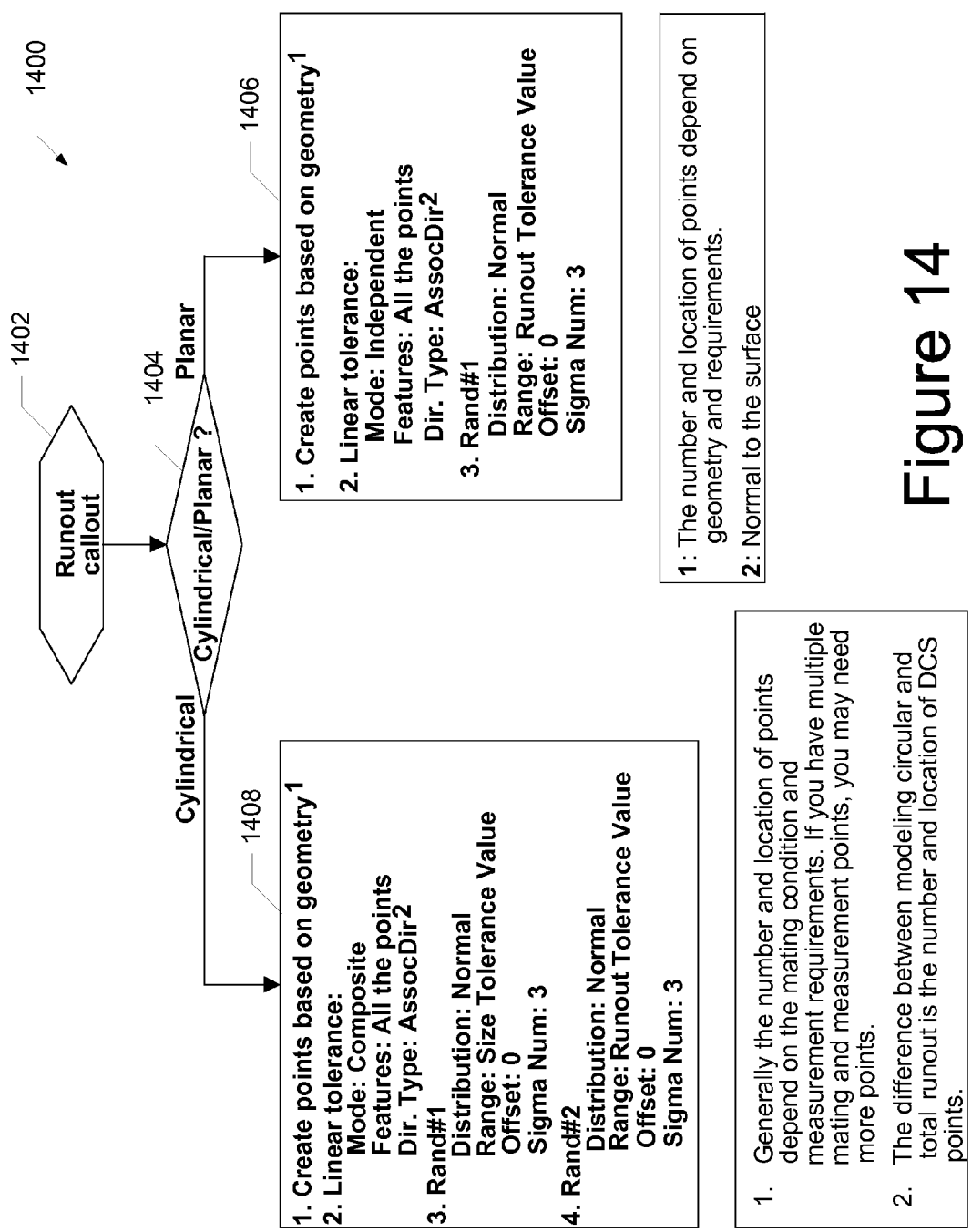
FIG. 14 illustrates an exemplary conversion or translation process for a GD&T runout tolerance callout.

FIG. 14 illustrates an exemplary process for converting a GD&T runout tolerance callout to variation parameters. Process 1400 begins at block 1402 when a runout tolerance is selected by the user or extracted from the CAD program. Block 1404 checks to see if the callout is applied to cylindrical or planar item. For planar items, process 1400 moves to block 1406. Block 1406 provides an example of translation or conversion to variation parameters for runout tolerances applied to planar items. For cylindrical items, process 1400 moves to block 1408. Block 1408 provides an example of translation or conversion to variation parameters for runout tolerances applied to cylindrical items.

Figure 15:
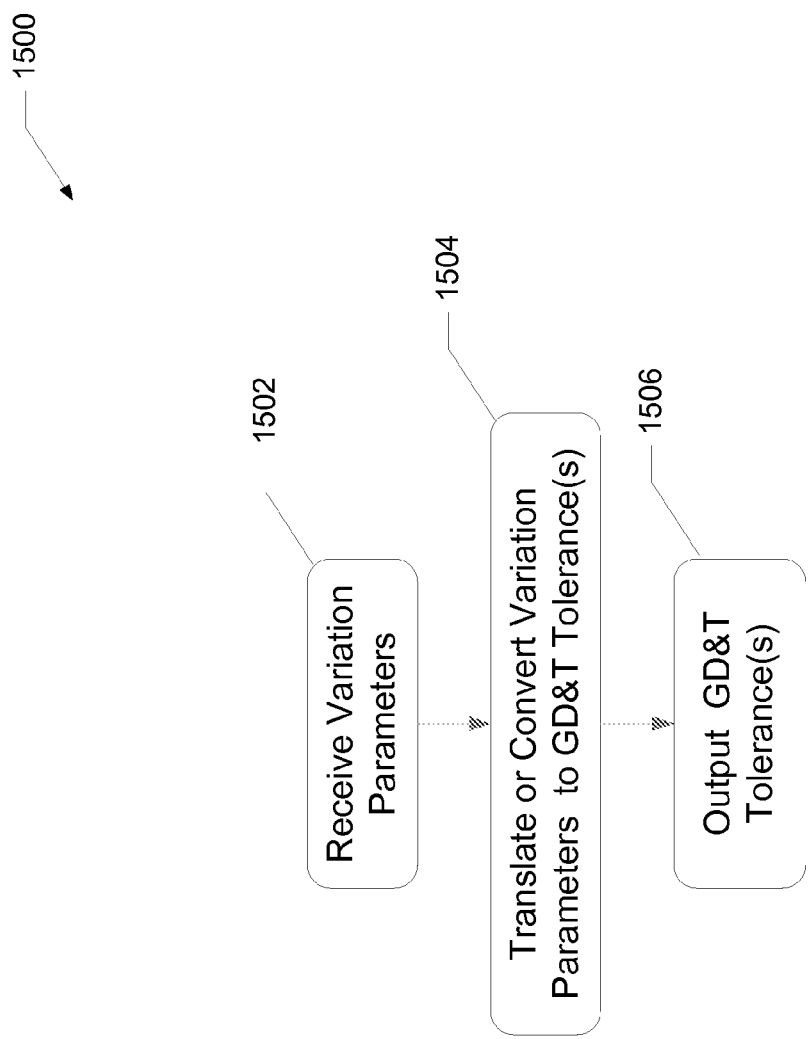
FIG. 15 illustrates an exemplary process for translating or converting variation parameters from a 3D variation analysis tool to GD&T tolerance call out(s) in accordance with one embodiment.

FIG. 15 illustrates one example of a process that may be used to convert variation parameters for a 3D variation model to GD&T tolerance callouts. Process 1500 begins with block 1502 where the variation parameters for a 3D variation model are received. In block 1504 the variation parameters for a 3D variation model are converted to GD&T tolerance callouts. Thereafter the GD&T tolerance callouts are output in block 1506.

In some embodiments, the output is to a display or printer. In other embodiments, the output may be directly to the GD&T tool. While outputting to the tool saves time, the translator or converter must be programmed to output the data in a format the particular GD&T tool can use. In contrast, when the user receives the output, the user can check to verify that the output values are in the expected range and that an input error was not made.

In some embodiments the translator or converter is a tool or software that is installed in memory on a computer. The computer may be a special purpose or general purpose computer. In other embodiments the tool or software is stored on a computer readable medium.

Similar to FIG. 2, an exemplary conversion/translation process could add additional steps to those shown in FIG. 15. For example, the process could display a tolerance type list. Typically, this list may be displayed on a computer monitor. However, in some embodiments, the display could include the output of a printer. Other devices that provide visual, tactile or audio output to a user could also be used.

Thereafter, the process could receive a user selection of one of the tolerance types from the list displayed. In response to receiving the user's selection, a dialog for the selected tolerance type may be displayed. Typically, the dialog is displayed on a monitor or other visual display. In other embodiments, devices that provide visual, tactile or audio output to a user could also be used.

The process may then receive the entered variation data. The data may include the variation parameters, answers to questions about the variation parameters or model, and other variation information. In some embodiments, the user would indicate that the dialog was complete by requesting the process translate or convert the variation data. Thereafter, the process may receive this request. The user may make a request by selecting a button with a pointing device or striking/pushing one or more keys on keyboard.

The entered variation data is converted or translated into GD&T callouts. The GD&T callout(s) may be output using a display or printer. In other embodiments devices that provide visual, tactile or audio output to a user could also be used.

FIGS. 16-20 provide examples of processes that may be used to convert variation parameters to GD&T tolerance callouts. Based on the examples provided, a person of ordinary skill, can develop processes for other situations.

Figure 16:
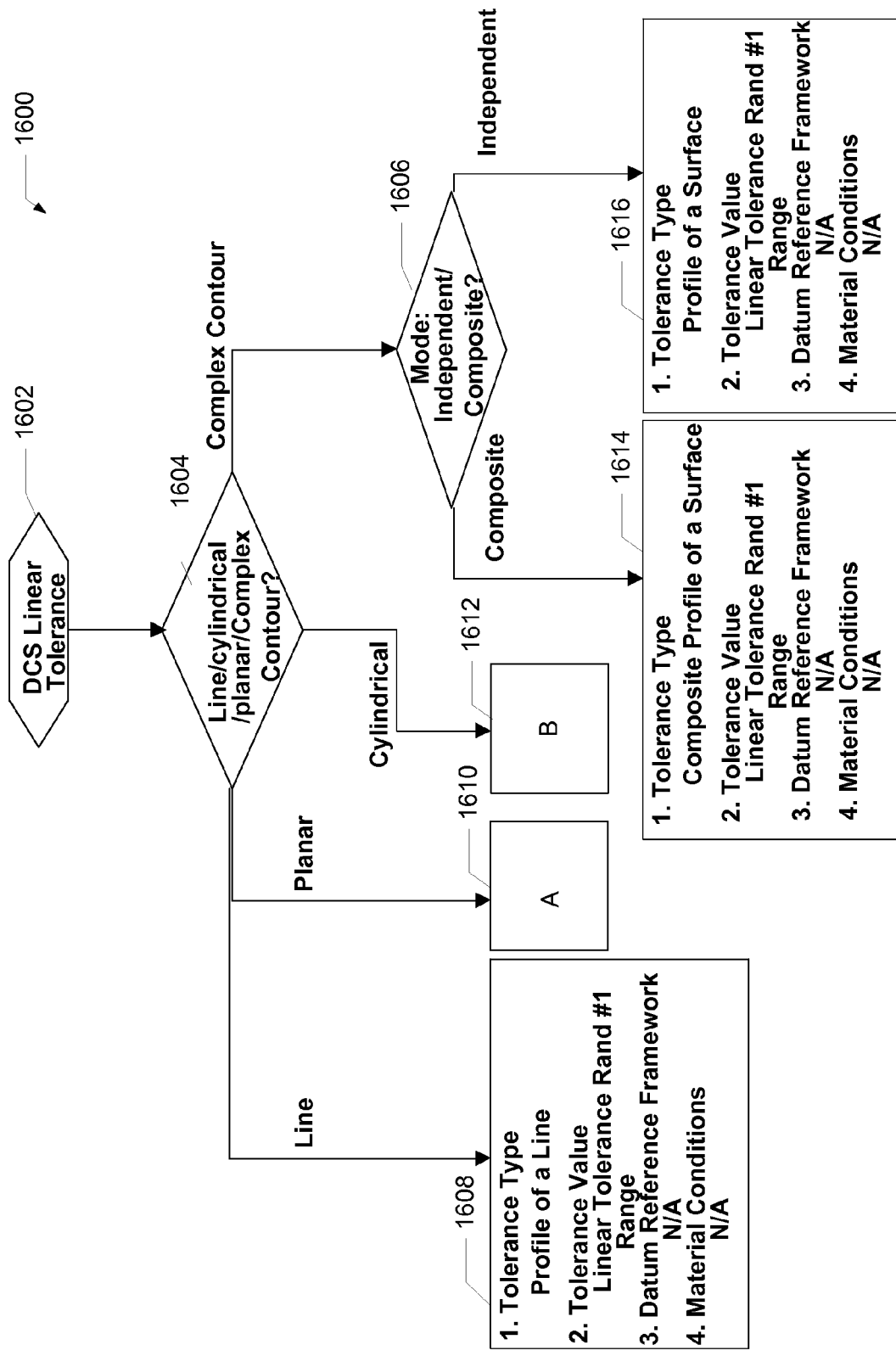
FIGS. 16-18 illustrate an exemplary conversion or translation process for a DCS linear tolerance.

FIG. 16 illustrates an exemplary process for converting linear variation parameters to a GD&T tolerance callouts. Process 1600 begins at block 1602 when a linear variation parameter is selected by the user or extracted from the 3D variation model. Block 1604 checks to see if the parameters relate to a line, planar item, cylindrical item, or an item with a complex contour.

When the parameters relate to a line, process 1600 moves to block 1608. Block 1608 provides an example of translation or conversion to GD&T for linear variation parameters for linear items. When the parameters relate to planar items, process 1600 moves to block 1610. Block 1610 continues the process at block 1702 on FIG. 17. When the parameters relate to a cylindrical item, process 1600 moves to block 1612. Block 1612 continues the process at block 1802 on FIG. 18.

When the parameters relate to an item with a complex contour, process 1600 moves to block 1606. Block 1606 determines whether the mode of the complex contour parameter is composite or independent. If the mode is composite, then the process 1600 moves to block 1614. Block 1614 provides an example of translation or conversion to GD&T for linear variation parameters for items with complex contours that have a composite mode. If the mode is independent, then the process 1600 moves to block 1616. Block 1616 provides an example of translation or conversion to GD&T for linear variation parameters for items with complex contours that have an independent mode.

Figure 17:
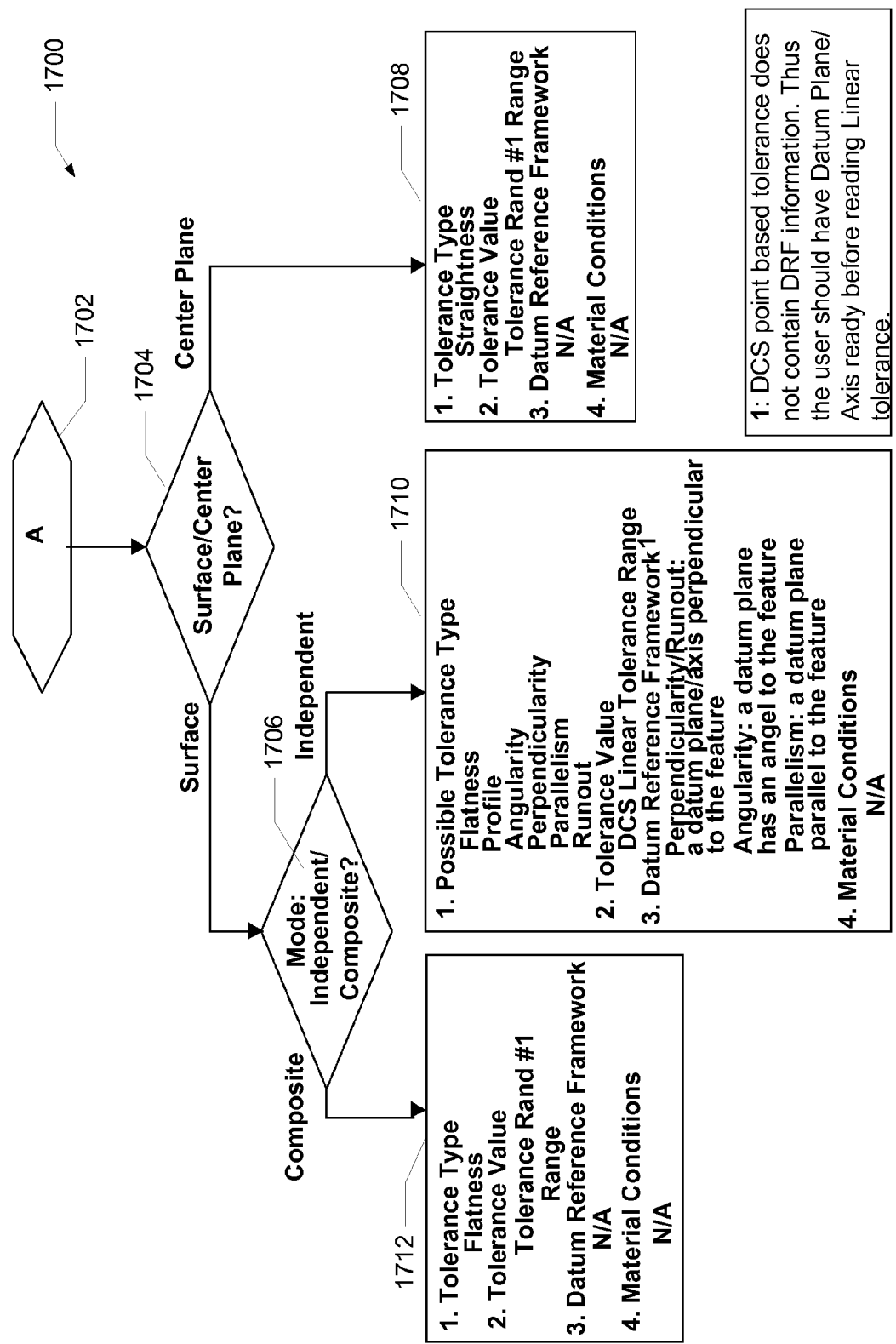

FIG. 17 illustrates a continuation of process 1600 for planar items. Process 1700 begins at block 1702 when block 1604 determines that the linear variation parameters are applied to a planar item. Block 1704 checks to see if the plane is a surface plane or a center plane. When the plane is a center plane, the process 1700 moves to block 1708. Block 1708 provides an example of translation or conversion to GD&T for linear variation parameters for planar items with a center plane.

When the plane is a surface plane, process 1700 checks to see if the mode is independent or composite in block 1706. When the mode is composite, the process 1700 moves to block 1712. Block 1712 provides an example of translation or conversion to GD&T for linear variation parameters for planar items with a surface plane having a composite mode. If the mode is independent, process 1700 moves to block 1710. Block 1710 provides an example of translation or conversion to GD&T for linear variation parameters for planar items with a surface plane having an independent mode.

Figure 18:
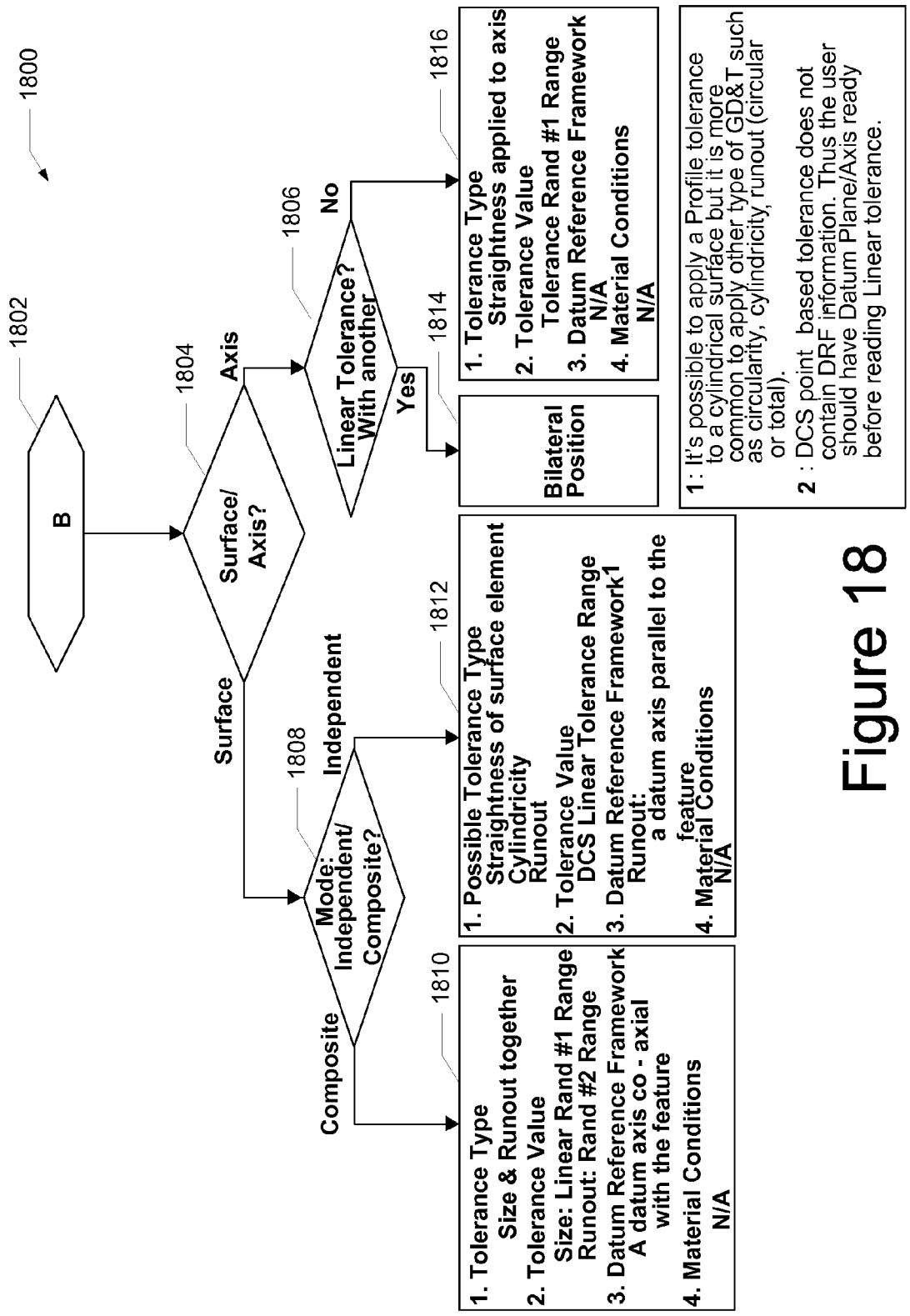

FIG. 18 illustrates a continuation of process 1600 for cylindrical items. Process 1800 begins at block 1802 when block 1604 determines that the linear variation parameters are applied to a cylindrical item. Block 1804 checks to see if the item is an axis or a cylindrical surface. When an axis, the process 1800 moves to block 1806. Block 1806 checks to see if there are variation parameters related to another linear tolerance. If there is another linear tolerance, process 1800 moves to block 1814. Block 1814 provides an example of translation or conversion to a bidirectional GD&T callout. When there is not another linear tolerance, process 1800 moves to block 1816. Block 1816 provides an example of translation or conversion to GD&T for linear variation parameters for items with an axis.

If the tolerance applies to a cylindrical surface, process 1800 moves to block 1808. Block 1808 checks the mode of the cylindrical surface. If the mode is independent, process 1800 moves to block 1812. Block 1812 provides an example of translation or conversion to GD&T for linear variation parameters for cylindrical surfaces having an independent mode. When the mode is composite, process 1800 moves to block 1810. Block 1810 provides an example of translation or conversion to GD&T for linear variation parameters for cylindrical surfaces having a composite mode.

Figure 19:
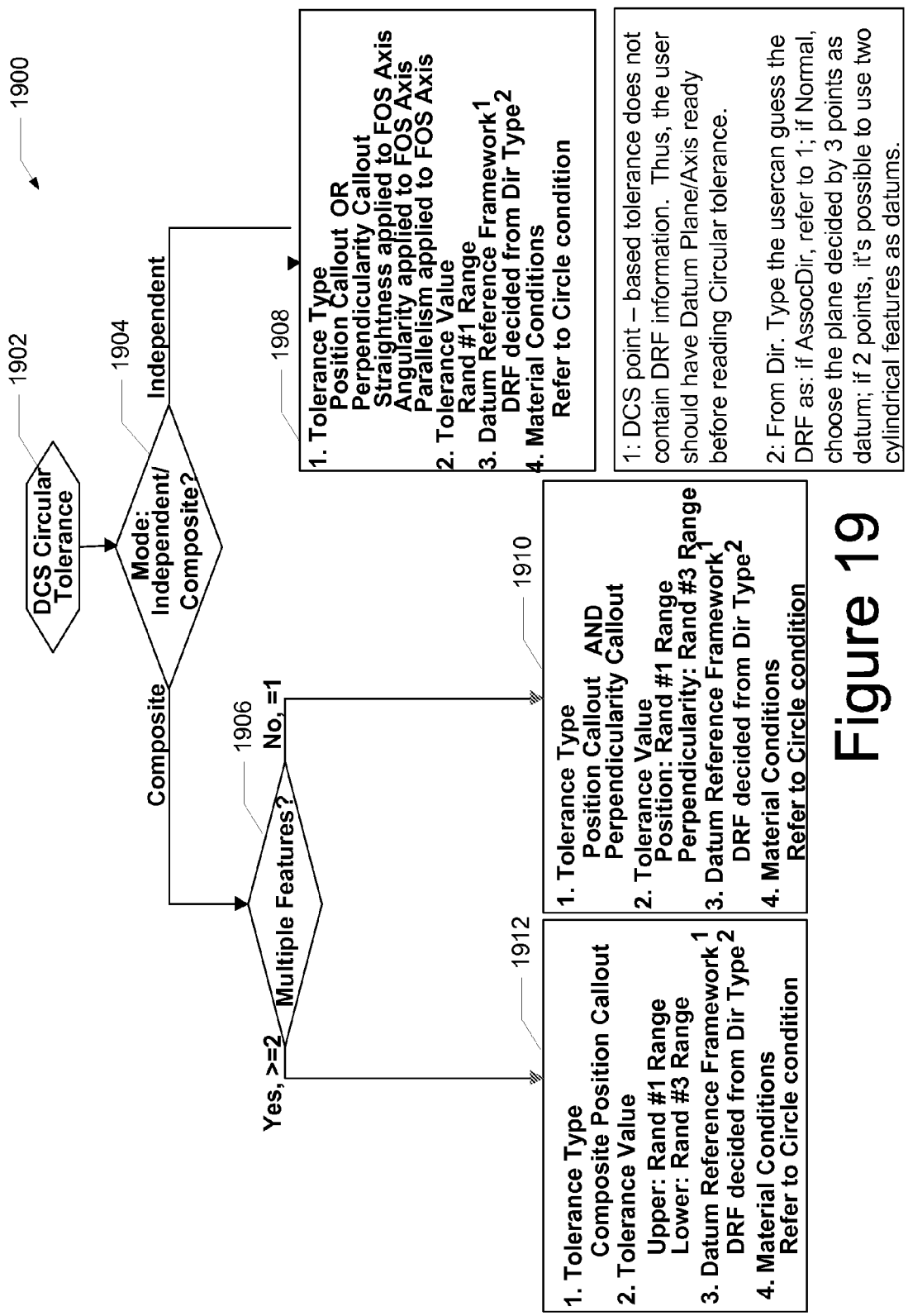
FIG. 19 illustrates an exemplary conversion or translation process for a DCS circular tolerance.

FIG. 19 illustrates an exemplary process for converting variation parameters related to circular tolerances to GD&T callouts. Process 1900 begins at block 1902 when a circular tolerance is selected by the user or extracted from the 3D variation model. Block 1904 checks to see if the mode of the tolerance is independent or composite. When the mode is independent, process 1900 moves to block 1908 where the GD&T callout based on variation parameters for a circular tolerance with an independent mode is created.

If the mode is composite, process 1900 moves to block 1906. In block 1906 process 1900 checks to see if multiple features are included. When there is a single feature, process 1900 moves to block 1910, where a GD&T callout is created based on variation parameters for a circular tolerance with a composite mode and a single feature. If there are multiple features, process 1900 moves to block 1912. At block 1912, a GD&T callout is created based on variation parameters for a circular tolerance with a composite mode and multiple features.

Figure 20:
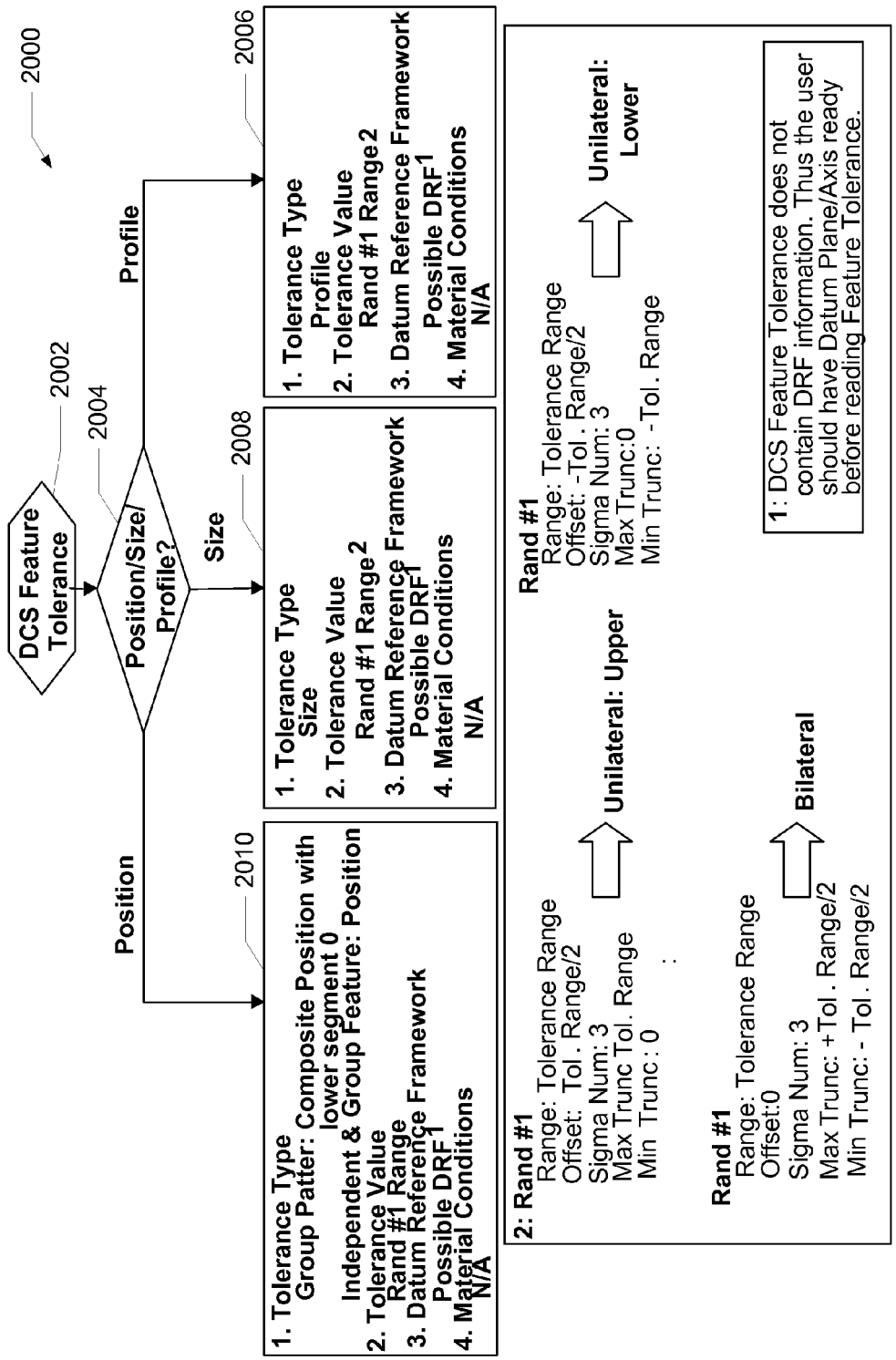
FIG. 20 illustrates an exemplary conversion or translation process for a DCS feature tolerance.

FIG. 20 illustrates an exemplary process for converting variation parameters for feature tolerance to a GD&T callout. Process 2000 begins at block 2002 when a feature tolerance is selected by the user or extracted from the 3D variation model. Block 2004 checks to see if the tolerance is applied to a position, size or profile. When the tolerance is applied to a profile, the process 2000 moves to block 2006. Block 2006 provides an example of translation or conversion from variation parameters for profile tolerances to a GD&T callout. When the tolerance is applied to feature size, the process 2000 moves to block 2008. Block 2008 provides an example of translation or conversion from variation parameters for size tolerances to a GD&T callout. When the tolerance is applied to a position, the process 2000 moves to block 2010. Block 2010 provides an example of translation or conversion from variation parameters for position tolerances to a GD&T callout.

Figure 22:
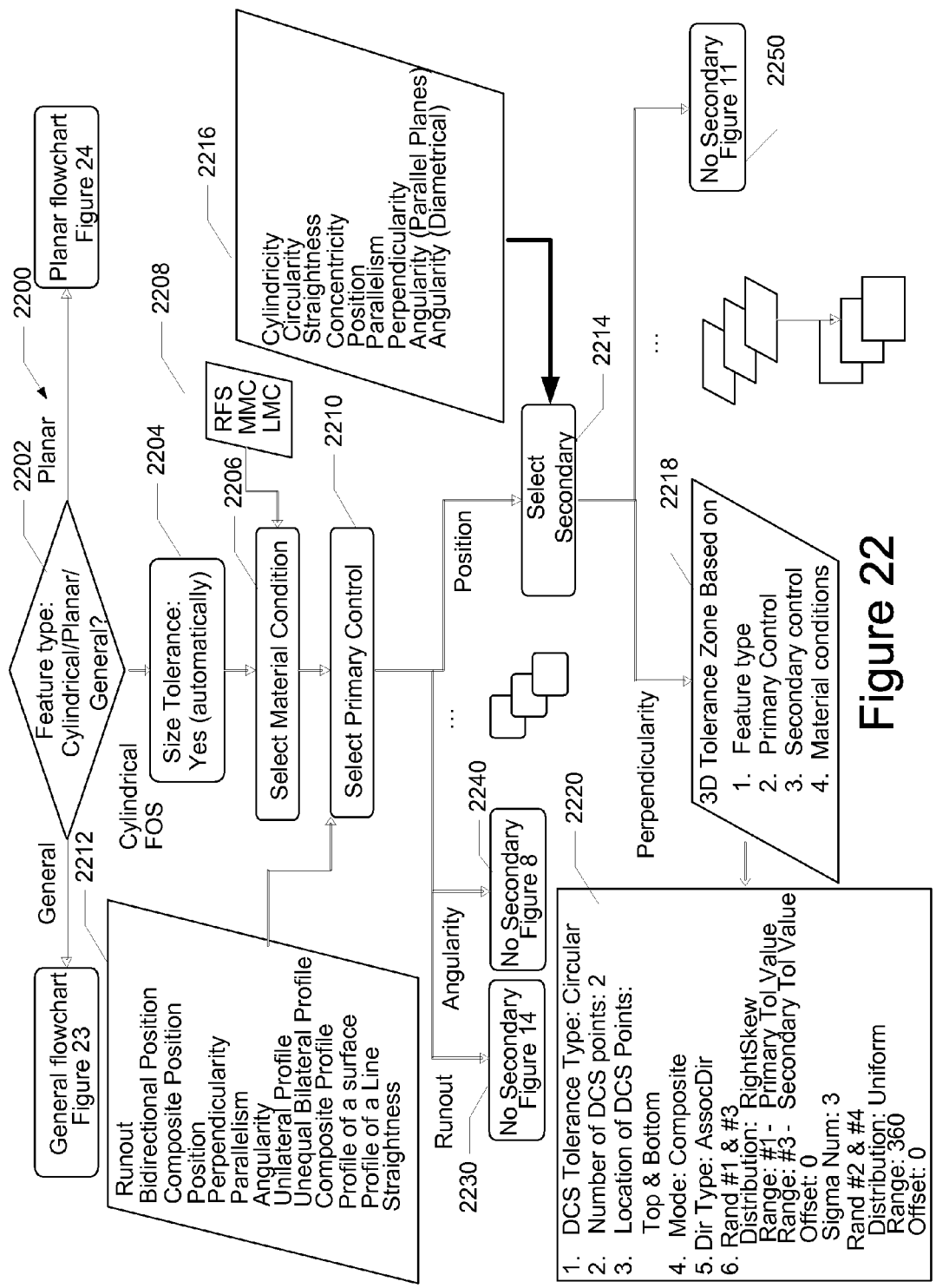
FIGS. 22-24 illustrate exemplary details of a process for translating or converting GD&T tolerance(s) to variation parameters for a 3D variation analysis tools in accordance with a further embodiment Reference will now be made in detail to embodiments of the disclosure, examples of which are illustrated in the accompanying drawings.
Figure 23:
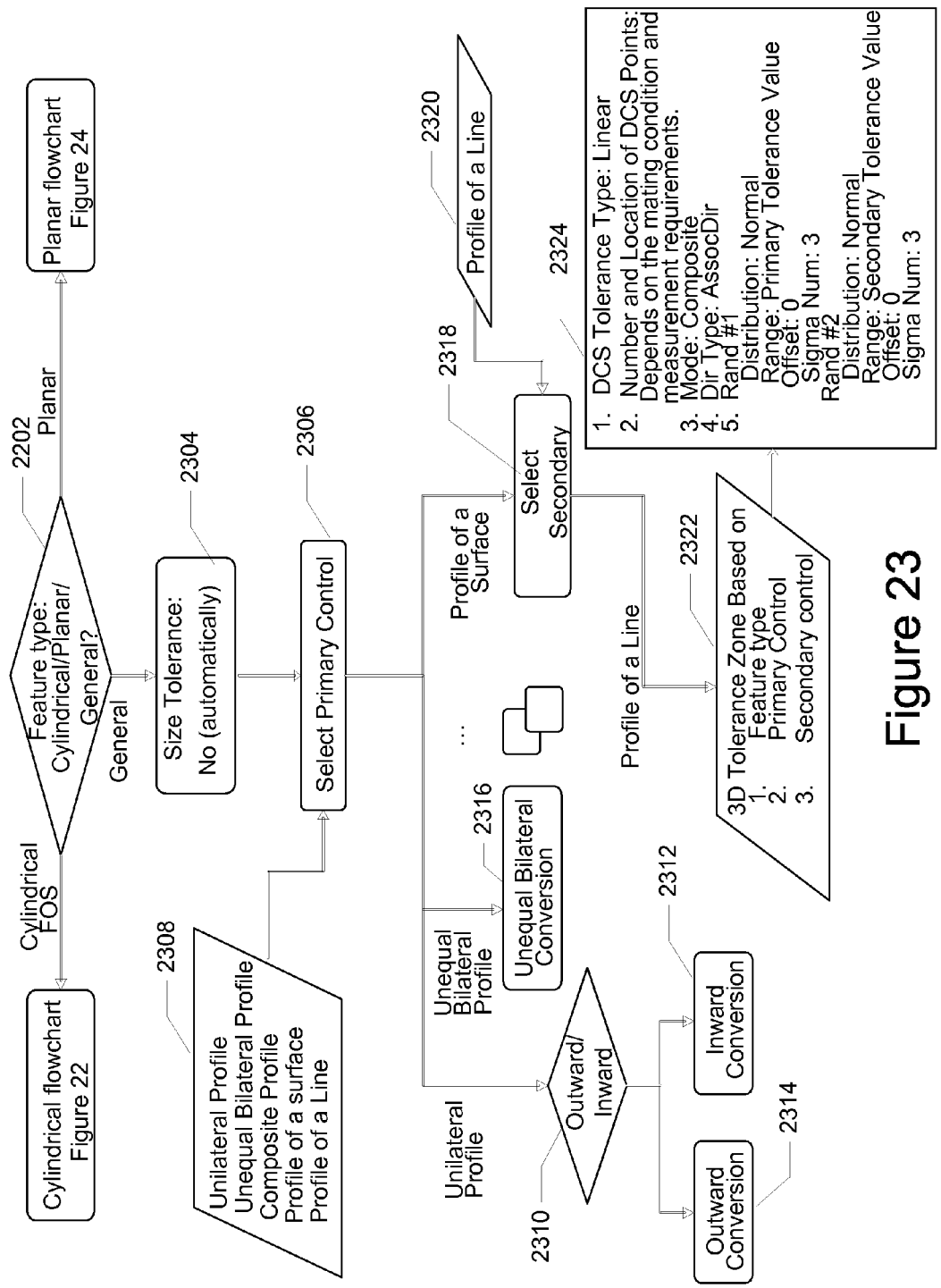
Figure 24:
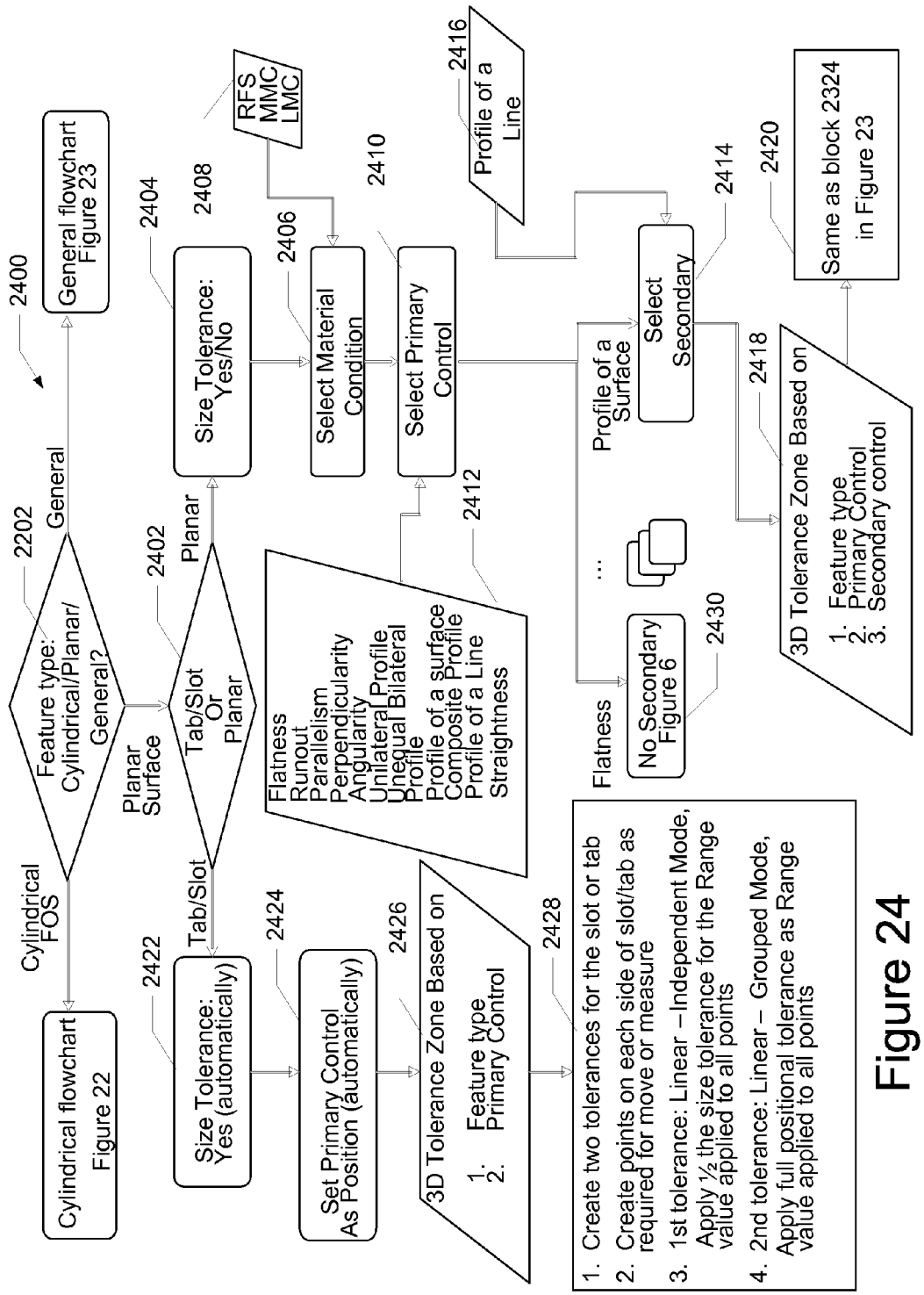

FIGS. 22-24 provide examples of various processes that may be used to convert GD&T tolerances to variation parameters when a surface is selected first and the tolerance callouts or controls are considered later. Based on the examples provided, a person of ordinary skill can develop additional processes if desired.

FIG. 22 illustrates an exemplary process 2200 for a cylindrical feature of size (FOS). Process 2200 begins when the cylindrical feature of size is selected or identified in decision block 2202. If a general feature is selected, the process moves to process 2300 shown in FIG. 23. When a planar feature is selected, the process moves to processes 2400 shown in FIG. 24.

When the cylindrical feature of size is selected or identified in decision block 2202, process 2200 moves to block 2204 where a size tolerance may be entered. In the illustrated embodiment, the size tolerance is automatically selected. In other embodiments there may not be an automatic selection.

In some embodiments the data/information entry required for process 2200 may be made using a single dialog. In other embodiments multiple dialogs may be used. Further embodiments may use other data entry methods currently known or developed in the future.

In block 2206 the material condition may be entered. Block 2208 provides examples of material conditions that may be considered. In some embodiments, the material condition may be entered using a text field with a drop down list. In other embodiments a textbox or radio buttons may be used.

In block 2210 a primary control is selected. Block 2212 provides examples of primary controls that may be considered. In some embodiments, the primary control may be entered using a text field with a drop down list. In other embodiments a textbox or radio buttons may be used.

When the primary control is the runout control and there is no secondary control, process 2200 moves to process 1400 block 1408 described above in block 2230. Similarly, if the primary control is an angularity control with no secondary control, then process 2200 moves to process 800 at block 802 described above in block 2240. Other primary controls without a secondary control would be treated in a similar fashion.

Block 2214 illustrates an example of a position control with a secondary control. Examples of the secondary controls are illustrated in block 2216. The secondary control may be selected in a similar fashion as the primary control discussed above. When there is no secondary control, the process 2200 moves to block 2250. In block 2250, process 2200 moves to process 1100 at block 11108.

When there is a secondary control, for example perpendicularity, the process moves to block 2218. In block 2218 a 3D tolerance zone based on feature type, primary control, secondary control and material condition is identified. Block 2220 is an example of the conversion process for a cylindrical feature of size with position as the primary control and perpendicularity as the secondary control. Based on this disclosure a person of ordinary skill can create conversion processes for other combinations of primary and secondary controls.

FIG. 23 illustrates an exemplary process 2300 for a general feature. Process 2300 begins when the general feature is selected or identified in decision block 2202. If a cylindrical feature of size is selected, the process moves to process 2200 shown in FIG. 22. When a planar feature is selected, the process moves to processes 2400 shown in FIG. 24.

When the general feature is selected or identified in decision block 2202, process 2300 moves to block 2304 where a size tolerance may be entered. In the illustrated embodiment, however, the size tolerance is automatically deselected. In other embodiments there may not be an automatic selection or de-selection.

In some embodiments the data/information entry required for process 2200 may be made using a single dialog. In other embodiments multiple dialogs may be used. Further embodiments may use other data entry methods currently known or developed in the future.

In block 2306 the primary control may be entered. Block 2308 provides examples of primary controls that may be considered. In some embodiments, the primary control may be entered using a text field with a drop down list. In other embodiments a textbox or radio buttons may be used.

When the primary control is a unilateral profile without a secondary control, then the process 2300 moves to block 2310. In block 2310 the process 2300 determines if the unilateral profile is inward or outward. If the profile is outward, the process 2300 moves to block 2314 to apply the GD&T to variation parameter conversion for the outward unilateral profile. If the profile is inward, the process 2300 moves to block 2312 to apply the GD&T to variation parameter conversion for the inward unilateral profile.

Similarly, when the unequal bilateral profile is selected as the primary control without a secondary control, then the process 2300 moves to block 2316. In block 2316 the process 2300 applies the GD&T to variation parameter conversion for the unequal bilateral profile. Similar conversions can be applied for the other primary controls.

Examples of the GD&T conversions are provided through out FIGS. 4-14, so that a person of ordinary skill could develop the specific conversion required for a particular situation. In some embodiments the optimum conversion may be developed by comparing models of the 3D space used by the GD&T tolerance to models of the 3D space used by the variation parameters.

When a secondary control is present then the process 2300 may use the additional data to develop the variation parameters. For example, FIG. 23 illustrates an embodiment where the profile of a surface control or tolerance includes a secondary control. In FIG. 23, process 2300 moves to block 2318 when the primary control is the profile of a surface control. Block 2320 illustrates that a profile of a line may be selected as the secondary control. In other embodiments, other secondary controls may be selected. The secondary control may be selected in the same manner as the primary control. In other embodiments, the secondary control may be selected using other selection processes known or developed in the future.

In block 2322 a 3D tolerance zone based on feature type, primary control, and secondary control is identified. Block 2322 is an example of the conversion process for a general feature with profile of a surface as the primary control and profile of a line as the secondary control. Based on this disclosure a person of ordinary skill can create conversion processes for other combinations of primary and secondary controls.

FIG. 24 illustrates an exemplary process 2400 for a planar feature. Process 2400 begins when the planar feature is selected or identified in decision block 2202. If a general feature is selected, the process moves to process 2300 shown in FIG. 23. When a cylindrical feature of size is selected, the process moves to processes 2200 shown in FIG. 22.

When the planar feature is selected or identified in decision block 2202, process 2400 moves to decision block 2402. In decision block 2402 process 2400 checks to see if the planar feature is a tab/slot or is another planar surface. When the planar surface is not a tab/slot, process 2400 moves to block 2404 where a size tolerance may be entered. In the illustrated embodiment, the size tolerance may selected by responding yes or no.

In some embodiments the data/information entry required for process 2400 may be made using a single dialog. In other embodiments multiple dialogs may be used. Further embodiments may use other data entry methods currently known or developed in the future.

In block 2406 the material condition may be entered. Block 2408 provides examples of material conditions that may be considered. In some embodiments, the material condition may be entered using a text field with a drop down list. In other embodiments a textbox or radio buttons may be used.

In block 2410 a primary control is selected. Block 2412 provides examples of primary controls that may be considered. In some embodiments, the primary control may be entered using a text field with a drop down list. In other embodiments, a textbox or radio buttons may be used.

When the primary control is the flatness control and there is no secondary control, process 2400 moves to process 600 described above in block 2430. Other primary controls without a secondary control would be treated in a similar fashion.

Block 2414 illustrates an example of a profile of a surface control with a secondary control. Examples of the secondary controls are illustrated in block 2416. The secondary control may be selected in a similar fashion as the primary control discussed above.

When there is a secondary control, for example profile of a line, the process moves to block 2418. In block 2418 a 3D tolerance zone based on feature type, primary control, and secondary control is identified. Block 2420 is an example of the conversion process for a planar feature with profile of a surface as the primary control and profile of a line as the secondary control. Based on this disclosure a person of ordinary skill can create conversion processes for other combinations of primary and secondary controls.

When the planar surface is a tab or slot, process 2400 automatically sets the size tolerance to yes in block 2422. In other embodiments the user may set the size tolerance to yes. In block 2424 the primary control may be set automatically to position. In other embodiments the user may select the primary control. Thereafter in block 2426, process 2400 selects or creates a 3D tolerance zone based on the feature type and the primary control. An example of the GD&T to variation parameter conversion is illustrated in block 2428.

The above-described systems and methods enable the translation or conversion between variation parameters for 3D variation modes and GD&T callouts. These and other techniques described herein may provide significant improvements over the current state of the art, potentially providing greater consistency in the translation or conversion.

Although the systems and methods have been described in language specific to structural features and/or methodological acts, it is to be understood that the system and method defined in the appended claims is not necessarily limited to the specific features or acts described. Rather, the specific features and acts are disclosed as exemplary forms of implementing the claimed systems and methods.

We claim:

1. A method for translating geometric dimensioning and tolerancing information to variation parameters for input into a three dimensional variation analysis tool, the method comprising:
receiving geometric dimensioning and tolerancing (GD&T) information in one or more GD&T callouts that are associated with an object surface depicted in a drawing, the GD&T information in each GD&T callout indicating an acceptable dimensional tolerance of the object surface based at least on pre-defined GD&T symbology;
translating, with a computer, the received GD&T information into variation parameters of the object surface which are compatible as input into the three dimensional variation analysis tool, the variation parameters including at least one of a size parameter, a primary parameter, or a refinement parameter; and
modeling the variation parameters of the object surface in a three-dimensional variation model to illustrate dimensional variations of the object surface.

2. The method of claim 1, wherein receiving GD&T information comprises:
displaying a list of tolerance types;
receiving a user selection from the list of tolerance types to convert to the variation parameters for input into the three dimensional variation analysis tool;
in response to the selection, displaying a dialog box specific to the selected tolerance type, the dialog providing areas for the user to enter tolerance data related to geometric dimensioning and tolerance information; and
receiving the entered tolerance data.

3. The method of claim 2, wherein translating, with a computer, the received GD&T information into the variation parameters for the three dimensional variation analysis tool comprises:
in response to the user requesting that the entered data or information be converted, converting the entered data or information to the variation parameters for the three dimensional variation analysis tool.

4. The method of claim 3, wherein outputting the variation parameters comprises: displaying or printing the variation parameters.

5. The method of claim 3, wherein the received GD&T information relates to a size tolerance, and wherein translating, with a computer, the received GD&T information into variation parameters for the three dimensional variation analysis tool further comprises:
using a first translation when the GD&T size tolerance is bilateral;
using a second translation when the GD&T size tolerance has an upper bound; and
using a third translation when the GD&T size tolerance has a lower bound.

6. The method of claim 3, wherein the received GD&T information relates to a straightness tolerance and wherein translating, with a computer, the received GD&T information into variation parameters for the three dimensional variation analysis tool further comprises:
using a first translation when the GD&T (GD&T) straightness tolerance is applied to a surface element;
using a second translation when the GD&T straightness tolerance is applied to a feature of size with a maximum material condition; and
using a third translation when the GD&T straightness tolerance is applied to a feature of size and applies regardless of feature size.

7. The method of claim 3, wherein the received GD&T information relates to a profile of a surface tolerance; and wherein translating, with a computer, the received GD&T information into variation parameters for the three dimensional variation analysis tool further comprises:
using a first translation when the GD&T profile of a surface tolerance is applied to a planar surface that does not have a datum;
using a second translation when the GD&T profile of a surface tolerance is applied to a planar surface that has a datum; and
using the second translation when the GD&T profile of a surface tolerance is applied to a non-planar surface that is not a partial revolving surface.

8. The method of claim 3, wherein the received GD&T information relates to an angularity tolerance; and wherein translating, with a computer, the received GD&T information into variation parameters for the three dimensional variation analysis tool further comprises:
using a first translation when the GD&T angularity tolerance is applied to a diametrical feature of size;
using a second translation when the GD&T angularity tolerance is applied to a plane surface; and
using a third translation when the GD&T angularity tolerance is applied to an axis.

9. The method of claim 3, wherein the received GD&T information relates to a perpendicularity tolerance; and wherein translating, with a computer, the received GD&T information into variation parameters for the three dimensional variation analysis tool further comprises:
using a first translation when the GD&T perpendicularity tolerance is not applied to a feature of size but has a planar datum;
using a second translation when the GD&T perpendicularity tolerance is applied to a cylindrical feature of size that has a planar datum controlled by tolerances; and
using a third translation when the GD&T perpendicularity tolerance is applied to a cylindrical feature of size that has a planar datum that is not controlled by tolerances.

10. The method of claim 3, wherein the received GD&T information relates to a parallelism tolerance; and wherein translating, with a computer, the received GD&T information into variation parameters for the three dimensional variation analysis tool further comprises:
using a first translation when the GD&T parallelism tolerance is applied to a diametrical feature of size that has a maximum material condition;
using a second translation when the GD&T parallelism tolerance is applied to a diametrical feature of size and the tolerance is applied regardless of the feature size;
using a third translation when the GD&T parallelism tolerance is applied to a plane surface; and
using a fourth translation when the GD&T parallelism tolerance is applied to an axis.

11. The method of claim 3, wherein the received GD&T information relates to a position tolerance; and wherein translating, with a computer, the received GD&T information into variation parameters for the three dimensional variation analysis tool further comprises:

using a first translation when the GD&T GD&T position tolerance is applied to a cylindrical feature that does not have composite control;

using a second translation when the GD&T position tolerance is applied to a cylindrical feature that has composite control and a pattern in a plane; and using a third translation when the GD&T position tolerance is applied to a cylindrical feature that has composite control and a pattern not in a plane.

12. A system that consistently translates geometric dimensioning and tolerancing (GD&T) information to variation parameters for input into a three dimensional variation analysis tool, the system comprising:

a processor;
an input device;
an output device; and
a computer readable data storage device, wherein the data storage device contains instructions that when called cause the processor to:

receiving geometric dimensioning and tolerancing (GD&T) information in one or more GD&T callouts that are associated with an object surface depicted in a drawing via the input device, the GD&T information in each GD&T callout indicating an acceptable dimensional tolerance of the object surface based at least on pre-defined GD&T symbology;

translating the received GD&T information into variation parameters of the object surface for the three dimensional variation analysis tool; and outputting the variation parameters via the output device.

13. The method of claim 12, wherein translating, with the processor, the received GD&T information into variation parameters for the three dimensional variation analysis tool comprises:

in response to the user requesting that the entered data or information be converted via the input device, converting the entered data or information to variation parameters for the three dimensional variation analysis tool with the processor.

14. The method of claim 13, wherein outputting the variation parameters comprises:

displaying or printing the variation parameters.

15. The method of claim 12, wherein receiving GD&T information via the input device comprises:

displaying a list of tolerance types on the output device;
receiving a user selection from the list of tolerance types to convert to variation parameters for input into the three dimensional variation analysis tool with the input device;

in response to the selection, displaying a dialog box specific to the selected tolerance type, the dialog providing areas for the user to enter tolerance data related to geometric dimensioning and tolerance information on the output device; and receiving the entered tolerance data through the input device.

16. A method for translating variation parameters from three-dimensional (3D) variation models into geometric dimensioning and tolerancing (GD&T) information, the method comprising:

receiving variation parameters of an object surface for modeling the object surface object surface using a 3D variation model that illustrates dimensional variations of the object surface;

translating, with a computer, the received variation parameters from the 3D variation analysis tool into GD&T information that are encapsulated in GD&T callouts for the object surface, the GD&T information indicating an acceptable dimensional tolerance of the object surface based at least on pre-defined GD&T symbology; and outputting the GD&T callouts that encapsulates the GD&T information.

17. The method of claim 16,
wherein receiving variation parameters comprises:
displaying a list of tolerance types;
receiving a user selection from the list of tolerance types to convert variation parameters from the 3D variation analysis tool into GD&T information;

in response to the selection, displaying a dialog box specific to the selected tolerance type, the dialog providing areas for the user to enter variation parameters from the 3D variation model; and receiving the entered tolerance data.

18. The method of claim 17, wherein translating, with a computer, the received variation parameters for the 3D variation analysis tool into GD&T information comprises:

in response to the user requesting that the entered data or information be converted, converting the entered data or information from variation parameters into GD&T information.

19. The method of claim 3, wherein outputting the GD&T information comprises:

displaying or printing the GD&T information.

* * * * *